United States Patent
Kawai et al.

(10) Patent No.: US 6,912,166 B2
(45) Date of Patent: Jun. 28, 2005

(54) SEMICONDUCTOR MEMORY DEVICE AND TEST METHOD THEREOF

(75) Inventors: Koichi Kawai, Kanagawa (JP); Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/653,606

(22) Filed: Sep. 2, 2003

(65) Prior Publication Data

US 2004/0223384 A1 Nov. 11, 2004

(30) Foreign Application Priority Data

May 8, 2003 (JP) ........................................ 2003-130322

(51) Int. Cl.$^7$ ................................................. G11C 7/00
(52) U.S. Cl. ............. 365/201; 365/230.06; 365/189.07
(58) Field of Search ........................... 365/201, 189.07, 365/189.05, 230.03, 230.06, 233.5

(56) References Cited

U.S. PATENT DOCUMENTS 4,090,258 A * 5/1978 Cricchi ........................ 365/184
5,532,970 A * 7/1996 Butler et al. ............ 365/230.05
5,657,469 A * 8/1997 Shimizu ....................... 711/118

OTHER PUBLICATIONS

U.S. Appl. No. 09/968,706, filed Oct. 2, 2001.

* cited by examiner

Primary Examiner—Gene N. Auduong
(74) Attorney, Agent, or Firm—Hogan & Hartson, L.L.P.

(57) ABSTRACT

A semiconductor memory device disclosed herein comprises: a memory cell array divided into a plurality of blocks, each of which includes a plurality of memory cells; a plurality of row decoders which correspond to the blocks, each of the row decoders including an access information holder configured to hold access information indicating whether its corresponding row decoder has been accessed; and an access information reader configured to read the access information held in the access information holders.

23 Claims, 21 Drawing Sheets

US 6,912,166 B2

SEMICONDUCTOR MEMORY DEVICE AND TEST METHOD THEREOF

CROSS REFERENCE TO RELATED APPLICATION

This application claims benefit of priority under 35 U.S.C.§119 to Japanese Patent Application No. 2003-130322, filed on May 8, 2003, the entire contents of which are incorporated by reference herein.

BACKGROUND OF THE INVENTION

1. Field of the Invention

The present invention relates to a semiconductor memory device and a test method thereof, and particularly relates to a semiconductor memory device capable of checking whether a one-to-one correspondence is established between blocks and addresses in access operation.

2. Description of the Related Art

In a semiconductor memory device, in some cases, a wiring short occurs owing to dust generated during manufacturing or the like, which causes a defect (multi-selection defect) in which blocks (or rows) in a memory cell array are simultaneously selected at the time of access and a defect in which a one-to-one correspondence is not established between addresses and blocks (See FIG. 17 and FIG. 18).

Accordingly, in a test process, such a defective block needs to be replaced with a redundant block. Alternatively, they are treated as defective blocks in a test process, and when the number of defective blocks exceeds a permissible value of a chip, the defective chip needs to be removed.

FIG. 19 shows a test process of detecting such a defective block. As shown in FIG. 19, when the test process is started, "0" is written into all blocks (step S10). Namely, all memory cells in all the blocks are changed from "1" to "0".

Then, a block address N which is a variable is reset to "0" (step S12). Subsequently, a block erase is performed in a block at the block address N=0 (step S14). Namely, all data in memory cells in the block is erased, and the memory cells therein are changed to "1".

Thereafter, data is read from the selected block and compared with its expected value (step S16). Then, a diagonal pattern is written into the selected block (step S18). For example, "0" data is written into a memory cell of the first bit from the left end in the block at the block address N=0, and "0" data is written into a memory cell of the second bit from the left end in a block at a block address N=1. As described above, a different pattern is written in each block.

Next, whether the block address N at that point in time is a last block address is determined (step S20). When it is not the last block address (step S20: No), one is added to the block address N (step S22), and the aforementioned steps from step S14 are repeated.

On the other hand, when the block address N at that point in time is the last block address (step S20: Yes), the block address N is reset again to "0" (step S30) as shown in FIG. 20.

Then, the written data is read from the memory cells in the block at the block address N (step S32). The read data is then compared with its expected value (step S34). For example, it is determined whether the read data is "011111 . . . " when the block address N is "0" and whether the read data is "101111 . . . " when the block address N is "1".

Thereafter, whether the block address N at that point in time is the last block address is determined (step S36). When it is not the last block address (step S36: No), one is added to the block address N (step S38), and the aforementioned steps from step S32 are repeated.

On the other hand, when the block address N at that point in time is the last block address (step S36: Yes), this test process is completed.

A defective block found by the aforementioned test process needs not to be used in an actual operation. Namely, a row decoder circuit has a disable function which, even when a request for access to a defective block is received, allows the block address found in the test not to be selected. FIG. 21 shows a row decoder having the aforementioned disable function.

The row decoder shown in FIG. 21 includes a laser weld fuse FS, and by blowing this fuse FS, the corresponding defective block is not accessed.

Moreover, recently, a ROM fuse type row decoder such as shown in FIG. 22 is also realized to reduce costs and facilitate data conversion. In the row decoder shown in FIG. 22, by temporarily driving a fuse set signal FUSESET of a defective block high and fixing a node N10 of a latch circuit LT10 low, the same situation as when a fuse is blown is created. Namely, by fixing the node N10 of the latch circuit 10 low, a transistor Tr10 is turned off, and consequently, this block address can not be accessed. In other words, the latch circuit LT10 functions as a ROM which stores a defective block in a nonvolatile manner. Such a ROM fuse type row decoder is disclosed, for example, in Japanese Patent Laid-open No. 2002-117692 and its corresponding published U.S. patent application No. 2002/0039311. The entire contents of Japanese Patent Laid-open No. 2002-117692 and the published U.S. patent application No. 2002/0039311 are incorporated herein by reference.

In the aforementioned test, however, it is necessary that memory cells of each block are actually accessed, and that an erase operation, a write operation, and a read operation are performed in all blocks. Hence, there arises a problem that the test process needs a lot of time. In particular, with an increase in the capacity of a semiconductor memory device, the number of blocks increases, which causes a problem that the process of testing whether a one-to-one correspondence is established between blocks and addresses forms a significantly increased proportion of the entire test process.

SUMMARY OF THE INVENTION

In order to accomplish the aforementioned and other objects, according to one aspect of the present invention, a semiconductor memory device, comprises:

a memory cell array divided into a plurality of blocks, each of which includes a plurality of memory cells;

a plurality of row decoders which correspond to the blocks, each of the row decoders including an access information holder configured to hold access information indicating whether its corresponding row decoder has been accessed; and an access information reader configured to read the access information held in the access information holders.

According to another aspect of the present invention, a test method of a semiconductor memory device which comprises: a memory cell array divided into a plurality of blocks each of which including a plurality of memory cells; and a plurality of row decoders which correspond to the blocks, each of the row decoders including an access information holder configured to hold access information indicating whether its corresponding row decoder has been accessed, the test method comprises:

designating a block address and accessing the row decoder which corresponds to the block address;

reading the access information from all the access information holders;

determining whether the row decoder had been accessed is only the designated block address based on the read access information; and determining whether all block addresses are designated, and when all the block addresses are not designated, designating a new block address and repeating the steps from the step of accessing the row decoder.

DETAILED DESCRIPTION OF THE EMBODIMENTS

Embodiment

In the first embodiment, a latch circuit, which holds an access flag indicating whether there is access, is placed in a row decoder provided in each block. In a test process of determining whether a one-to-one correspondence is established between block addresses and actual blocks, whether there is access or not is determined based on the access flags held in the latch circuits without actual access to memory cells, whereby a reduction in test time is achieved. Further details will be given below.

Figure 1:
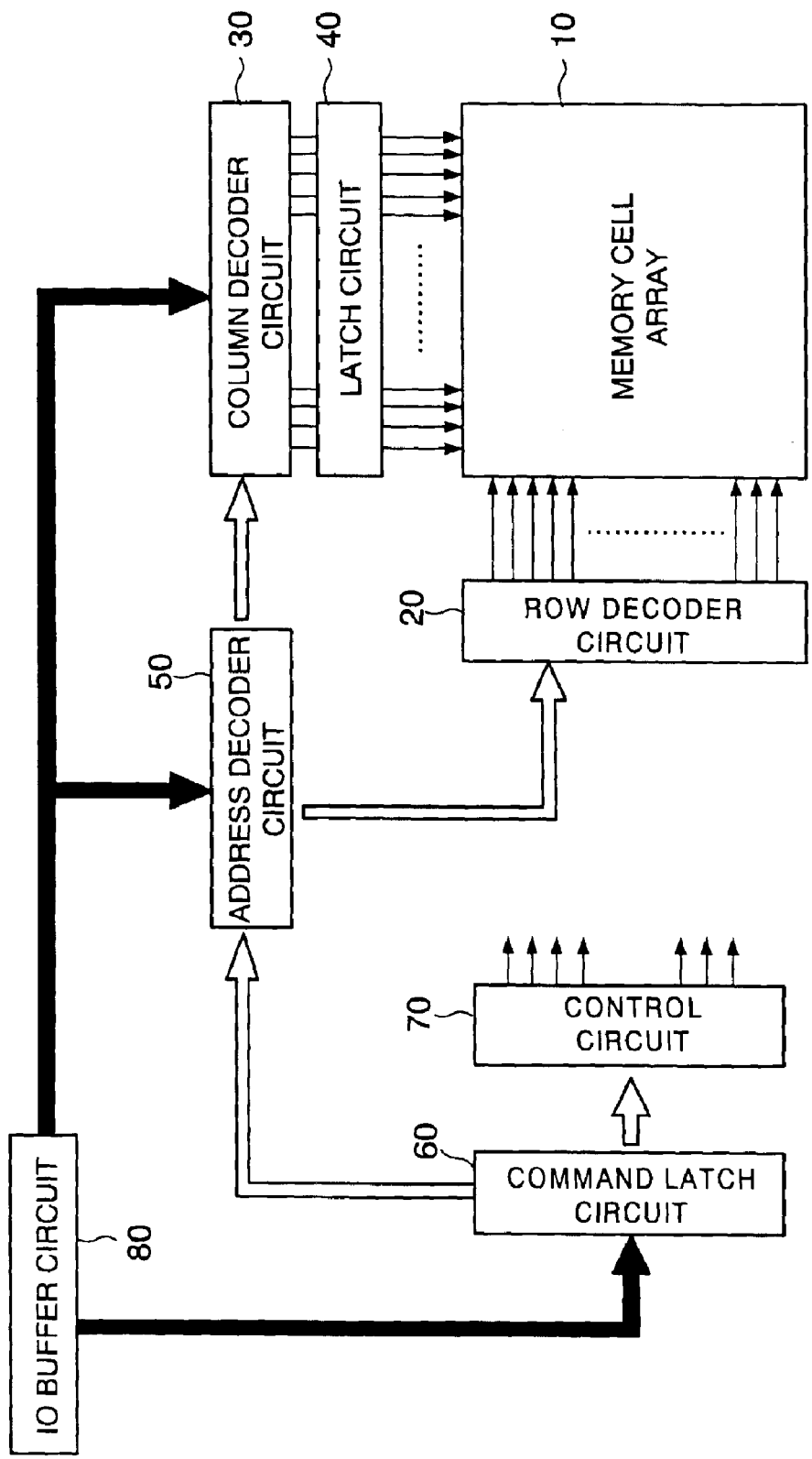
FIG. 1 is a block diagram explaining an example of the entire layout of a semiconductor memory device according to a first embodiment.

FIG. 1 is a block diagram schematically explaining the configuration of a semiconductor memory device according to this embodiment. FIG. 1 shows a nonvolatile semiconductor memory device, particularly a NAND-type nonvolatile semiconductor memory device, as an example of the semiconductor memory device.

As shown in FIG. 1, the semiconductor memory device according to this embodiment includes a memory cell array 10, a row decoder circuit 20, a column decoder circuit 30, a latch circuit 40, an address decoder circuit 50, a command latch circuit 60, a control circuit 70, and an IO buffer circuit 80.

An address signal outputted from the IO buffer circuit 80 is inputted to the address decoder circuit 50. In this address decoder circuit 50, a block address signal (row address signal) and a column address signal are generated based on the inputted address signal, then the block address signal is inputted to the row decoder circuit 20, and the column address signal is inputted to the column decoder circuit 30.

Plural memory cells are arranged in a matrix form in the memory cell array 10. One or more than one memory cell can be selected in the memory cell array 10 by the row decoder circuit 20 and the column decoder circuit 30. The latch circuit 40 is placed between the column decoder circuit 30 and the memory cell array 10. In a write operation, the latch circuit 40 holds data inputted from the IO buffer circuit 80 and outputs it to the memory cell array 10. In a read operation, the latch circuit 40 holds data on a memory cell read from the memory cell array 10 and outputs it to the IO buffer circuit 80.

A command signal is inputted from the IO buffer circuit 80 to the command latch circuit 60. The command latch circuit 60 latches the inputted command signal and outputs it to the control circuit 70. The control circuit 70 generates various control signals based on the inputted command signal and outputs them to various places inside the semiconductor memory device.

Figure 2:
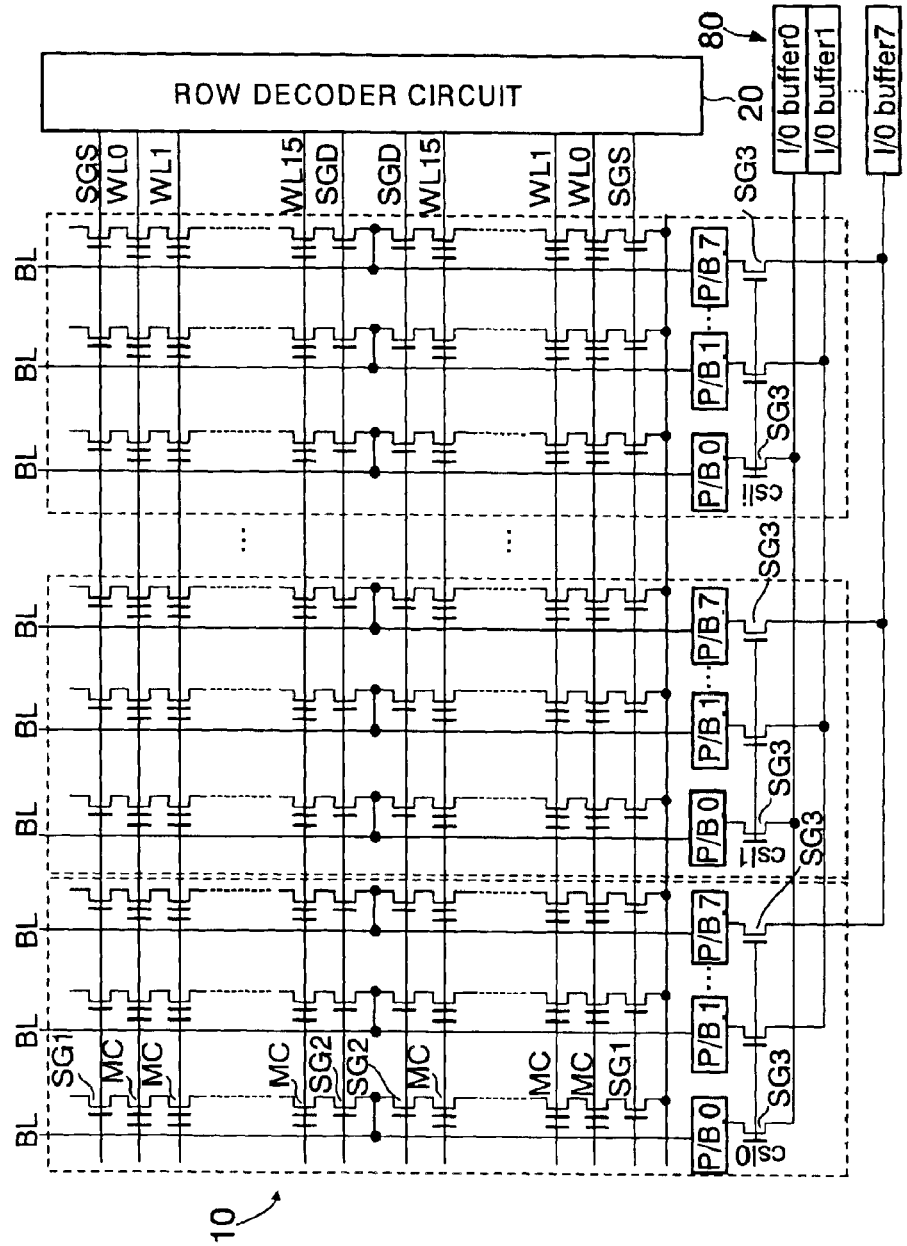
FIG. 2 is a diagram explaining an example of the internal configuration of a memory cell array in FIG. 1.

FIG. 2 is a diagram explaining the configuration of the memory cell array 10. As shown in FIG. 2, the memory cell array 10 according to this embodiment includes plural memory cells MC which are arranged in a matrix form. In this embodiment, the memory cell array 10 is a NAND-type flash memory. Namely, the plural memory cells MC are connected in series in such a manner that source and drain are shared. In this embodiment, 16 memory cells MC are connected in series.

A first select transistor SG1 is connected to one side of the memory sells connected in series, and a second select transistor SG2 is connected to the other side thereof. One NAND-type memory unit includes these first select transistor SG1, plural memory cells MC connected in series, and second select transistor SG2. The NAND-type memory unit is connected to a source line via the first select transistor SG1, and connected to a bit line BL via the second select transistor SG2.

Plural sets, each including a source select line SGS, 16 word lines WL0 to WL15, and a drain select line SGD, extend from the row decoder circuit 20. The source select line SGS is connected in common to gates of the first select transistors SG1 which are arranged in a word line direction. The word lines WL0 to WL15 are respectively connected in common to control gates of plural memory cells MC which are arranged in the word line direction. The drain select line SGD is connected in common to gates of the second select transistors SG2 which are arranged in the word line direction.

A bit line contact which connects the second select transistor SG2 and the bit line BL is shared between two NAND-type memory units arranged in a bit line direction. With eight bit lines BL as one set, the bit lines BL are connected to registers P/B_0 to P/B_7, respectively. The eight registers P/B_0 to P/B_7 are registers which temporarily hold write data and read data.

These eight registers P/B_0 to P/B_7 are respectively connected to I/O buffer 0 to I/O buffer 7 of the IO buffer circuit 80 via column select gates SG3. Common column select signal lines CSL0 to CSLi are inputted to eight column select gates SG3, respectively.

In this embodiment, a write unit is defined as one page. Namely, the range of the memory cells MC which can be selected by one word line WL is defined as one page. Therefore, the number of registers P/B_0 to P/B_7 corresponds to the number of the memory cells MC on one page. Hence, data read on a page-by-page basis is temporarily stored in the registers P/B_0 to P/B_7 and outputted from the I/O buffer 0 to I/O buffer 7 in units of one byte.

Unlike a write unit, in an erase unit, the memory cells MC formed on the same well are collectively erased. In this embodiment, this erase unit is defined as a block. Accordingly, in this embodiment, the memory cell array 10 including plural memory cells MC includes plural blocks.

Moreover, the semiconductor memory device according to this embodiment allows defective blocks. Therefore, the allowable number of defective blocks in one semiconductor memory device is prescribed, and if defective blocks fall within the prescribed range, the device is shipped as a non-defective.

A block address needs to be configured in such a manner that as a result of decoding by the address decoder 50, a one-to-one correspondence is established between the block address and an actual block. For example, in the case of a semiconductor memory device including 1024 actual blocks, a block address to specify a block needs 10 bits.

Figure 3:
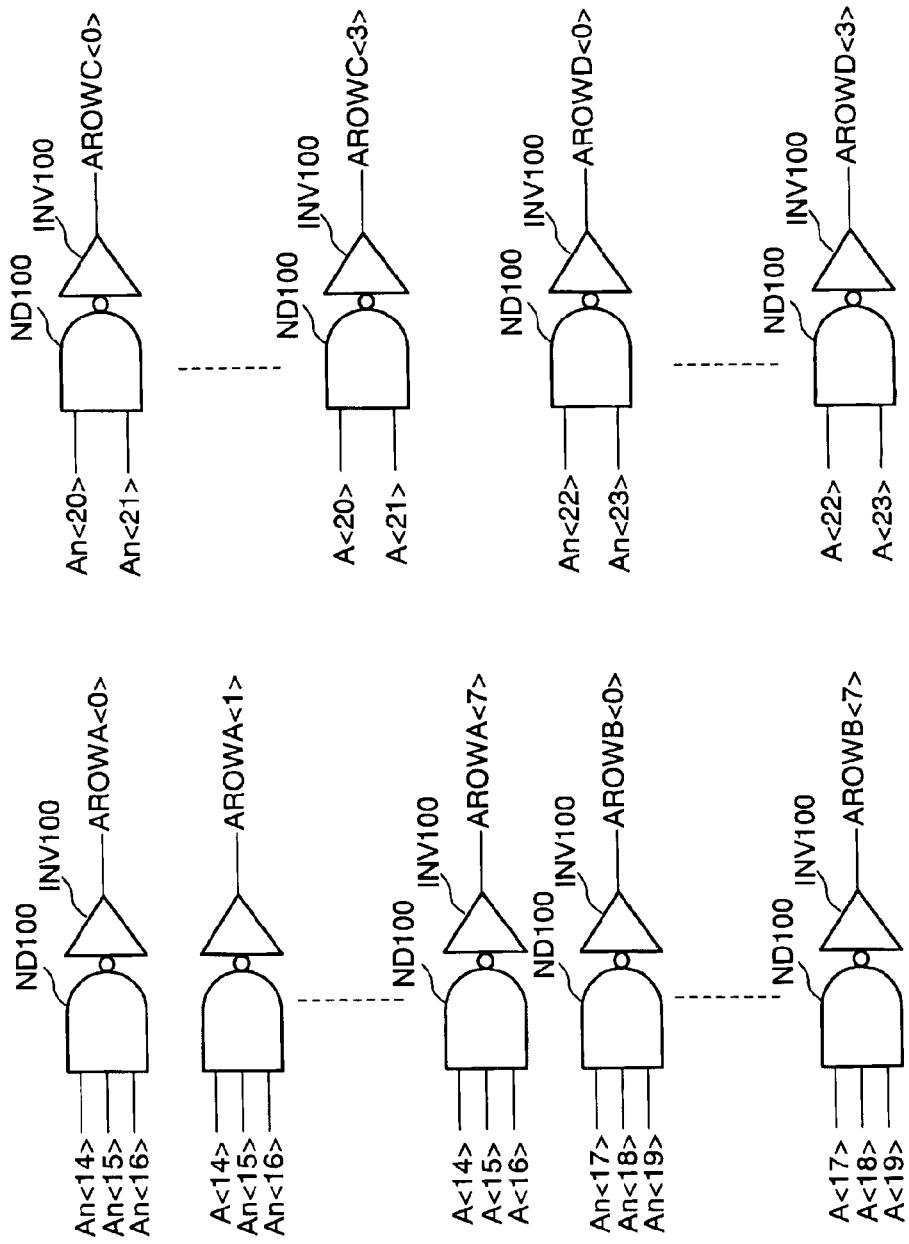
FIG. 3 is a diagram explaining an example of the internal configuration of an address decoder circuit in FIG. 1.

FIG. 3 is a diagram showing the configuration of a portion of the address decoder circuit 50 corresponding to a block address according to this embodiment. In the example in FIG. 3, 10 bits of address signals A<14> to A<23> correspond to the block address. As shown in FIG. 3, the address decoder circuit 50 is provided with plural NAND circuits ND100 and plural inverter circuits INV100. Out of the address signals A<14> to A<23> and inverted address signals An<14> to An<23>, 2 bits or 3 bits are inputted to each of the NAND circuits ND100. The inverted address signals An<14> to An<23> are signals obtained by inverting the address signals A<14> to A<23>.

An output signal of each of the NAND circuits ND100 is inputted to the inverter INV100. Row decoder signals AROWA<0> to AROWA<7>, AROWB<0> to AROWB<7>, AROWC<0> to AROWC<3>, and AROWD<0> to AROWD<3> are outputted from respective inverters INV100. These row decoder signals are inputted to the row decoder circuit 20, and a block is selected by the row decoder circuit 20.

Figure 4:
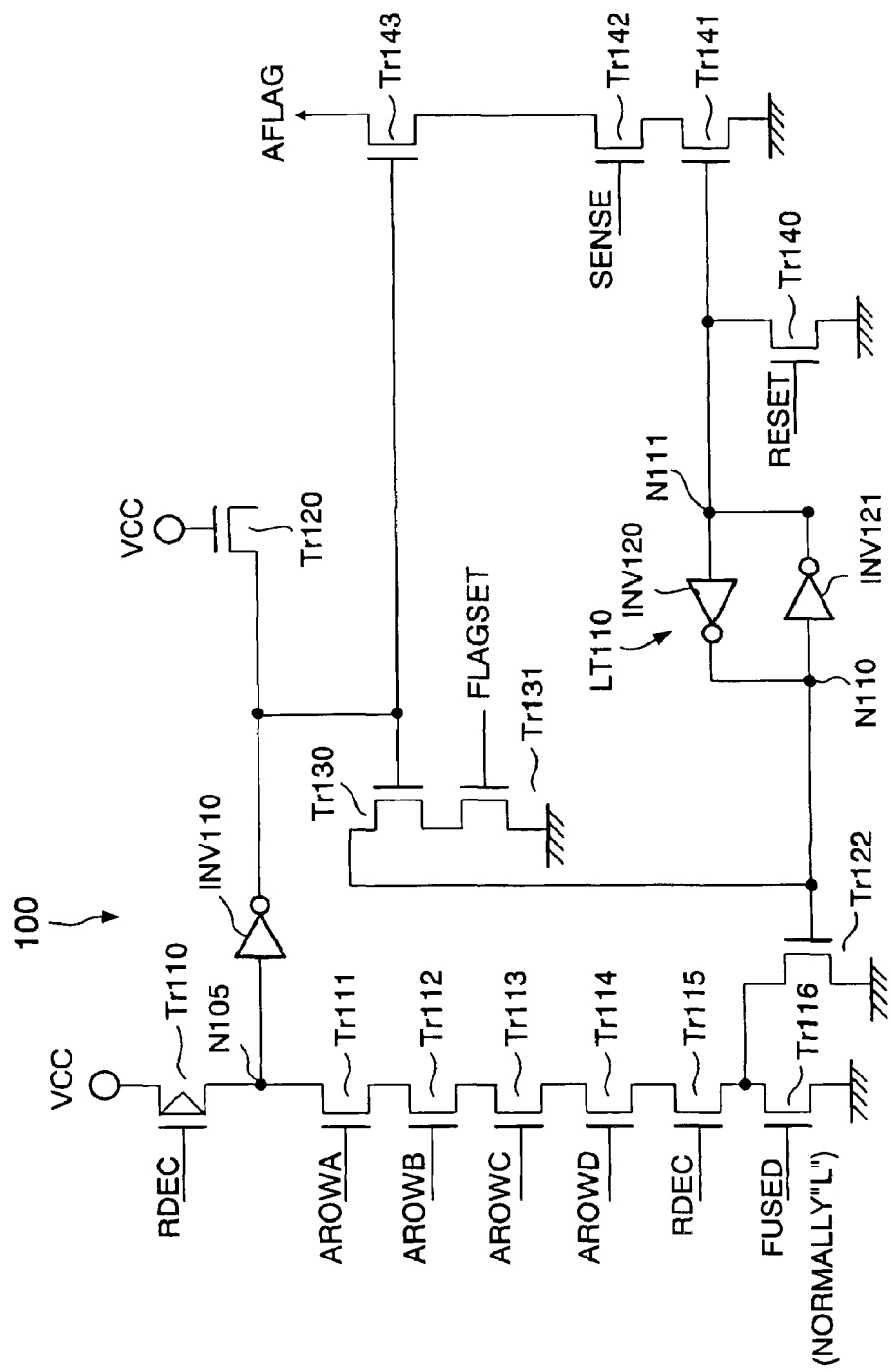
FIG. 4 is a diagram explaining an example of the circuit configuration of a row decoder according to the first embodiment.

FIG. 4 is a diagram showing a row decoder 100 provided in the row decoder circuit 20 according to this embodiment. The row decoder 100 configured as shown in FIG. 4 is provided for each block. In other word, the row decoder circuit 20 includes plural row decoders 100 provided corresponding to respective blocks.

As shown in FIG. 4, a P-type MOS transistor Tr110 and N-type MOS transistors Tr111 to Tr116 are connected in series between a supply voltage VCC and a ground. A block select signal RDEC is inputted to a gate of the MOS transistor Tr110. This block select signal RDEC is high when the corresponding block is selected and low when it is not selected.

Row decode signals AROWA, ARWOB, AROWC, and AROWD are inputted to gates of the MOS transistors Tr111 to Tr114, respectively. The row decode signal AROWA is any one of the row decode signals AROWA<0> to AROWA<7>. The row decode signal AROWB is any one of the row decode signals AROWB<0> to AROWB<7>. The row decode signal AROWC is anyone of the row decode signals AROWC<0> to AROWC<3>. The row decode signal AROWD is any one of the row decode signals AROWD<0> to AROWD<3>. Different row decode signals AROWA, AROWB, AROWC, and AROWD are inputted to the respective row decoders 100, whereby one row decoder 100 is selected.

The block select signal RDEC is inputted to a gate of the MOS transistor Tr115. A fuse disable signal FUSED is inputted to a gate of the transistor Tr116. The fuse disable signal FUSED is a signal which is normally low but goes high when it disables a fuse function.

A node N105 between the MOS transistor Tr110 and the MOS transistor Tr111 is connected to an inverter circuit INV110. An output of the inverter circuit INV110 is inputted to an N-type MOS transistor Tr120. This MOS transistor Tr120 is connected to the word line WL in the corresponding block in the memory cell array 10.

The output of the inverter circuit INV110 is also connected to a gate of an N-type MOS transistor Tr130. An N-type MOS transistor Tr131 is connected in series with the MOS transistor Tr130. A flag set signal FLAGSET is inputted to a gate of the MOS transistor Tr131.

One end side of the MOS transistor Tr130 is connected to a gate of an N-type MOS transistor Tr132. This MOS transistor Tr132 is a MOS transistor connected in parallel with the MOS transistor Tr116. Moreover, the gate of the MOS transistor Tr132 is also connected to a node N110 of a latch circuit LT110.

In this embodiment, this latch circuit LT110, in a normal operation, functions as a ROM fuse for storing that the block is a defective block, and in a test process, functions as an access flag storage circuit for determining whether a one-to-one correspondence is established between block addresses and actual blocks. Further, in this embodiment, the latch circuit LT110 includes an inverter circuit INV120 and an inverter circuit INV121, and it is configured by inputting an output of the inverter circuit INV120 to the inverter circuit INV121 and inputting an output of the inverter circuit INV121 to the inverter circuit INV120.

One end of an N-type MOS transistor Tr140 is connected to a node N111 of the latch circuit LT110, and the other end of the MOS transistor Tr140 is connected to a ground. A flag reset signal RESET is inputted to a gate of the MOS transistor Tr140.

The node N111 is also connected to a gate of an N-type MOS transistor Tr141. Moreover, N-type MOS transistors Tr142 and Tr143 are connected in series with the MOS transistor Tr141. A flag sense signal SENSE is inputted to a gate of the MOS transistor Tr142. The output of the inverter circuit INV110 is inputted to a gate of the MOS transistor Tr143.

The row decoder 100 shown in FIG. 4 is a circuit designed so that in the normal operation, the row decoder 100 corresponding to a designated block address is selected, and that a memory of a block corresponding to this row decoder 100 is selected. However, in the process of testing whether a one-to-one correspondence is established between block addresses and actual blocks, the row decoder 100 operates roughly as follows. First, the latch circuit LT110 of the row decoder 100 of each block is reset. Then, a block address "0" is accessed, and the latch circuit LT110 is set. At this time, if a block is selected correctly, only the latch circuit LT110 in the row decoder 100 at the block address "0" is set, and the latch circuits LT110 in the row decoders 100 at other block addresses remain reset. To confirm this, whether the block is correctly accessed is confirmed by reading the contents of the latch circuit LT110 in each block. By repeating such a series of operations from the block address "0" to a last block address, whether a one-to-one correspondence is established between block addresses and actual blocks can be tested.

Figure 5:
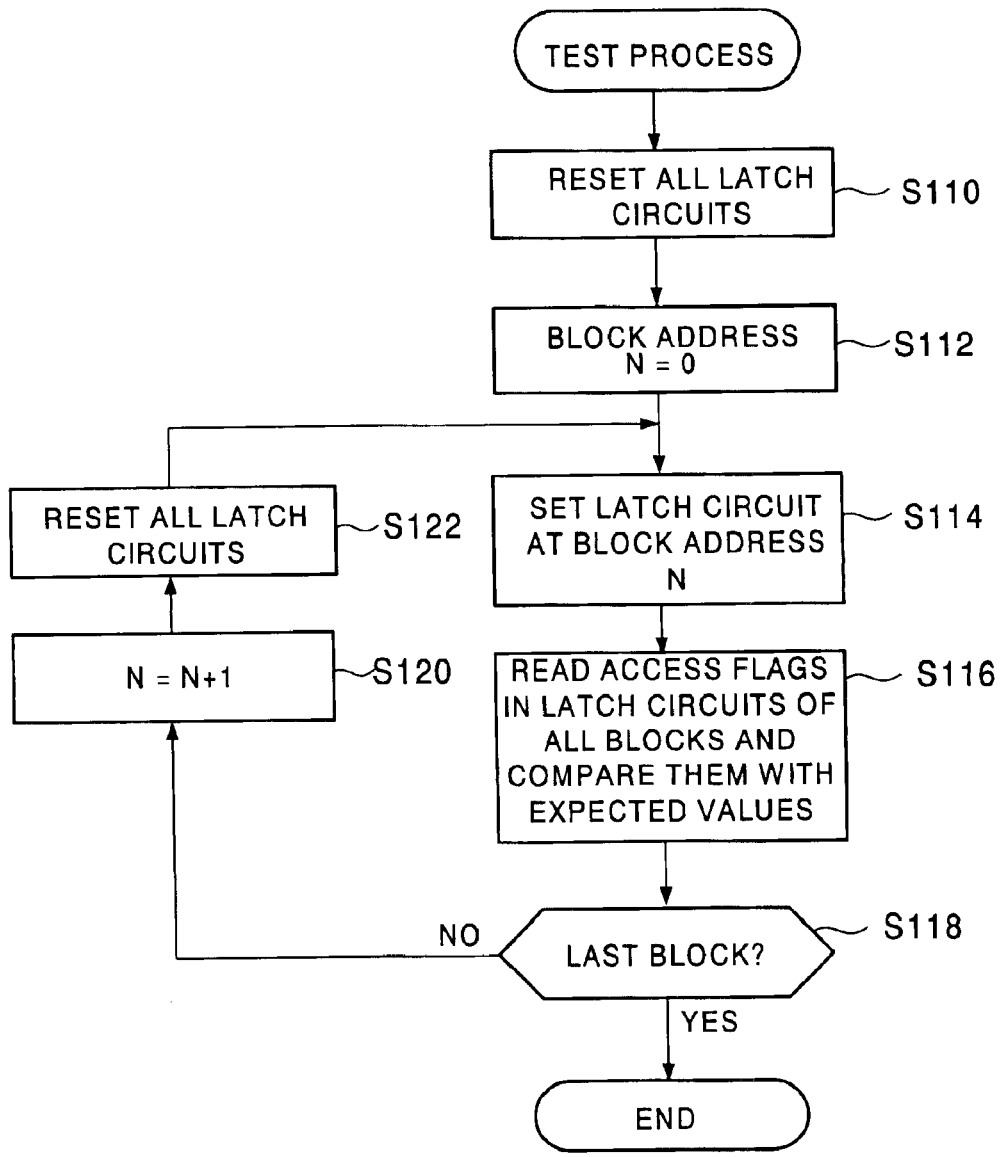
FIG. 5 is a diagram explaining an example of a test process of the semiconductor memory device according to the first embodiment.

FIG. 5 is a flowchart explaining the test process of testing whether a one-to-one correspondence is established between block addresses and actual blocks in the semiconductor memory device according to this embodiment.

As shown in FIG. 5, all the latch circuits LT110 of the row decoders 100 provided in respective blocks are reset (step S110). Specifically,the flag reset signal RESET which is inputted in common to the respective row decoders 100 is driven high to thereby turn on the MOS transistors Tr140. Consequently, the node N111 of the latch circuit 110 goes low, and the node N110 goes high. This state is a reset state of the latch circuit LT110 in this embodiment.

Then, a block address N is reset to "0" (step S112). Subsequently, by setting the latch circuit LT110 in the row decoder 100 at the block address N, an access flag is set (step S114). Specifically, the MOS transistors Tr111 to Tr114 in the row decoder 100 at the block address N are turned on. Moreover, since the block select signal RDEC goes high, the MOS transistor Tr115 is turned on and the MOS transistor Tr110 is turned off. Since the node N110 is high, the MOS transistor Tr132 is turned on. Therefore, the node N105 goes low and the output of the inverter circuit INV110 goes high. Hence, the MOS transistor Tr130 is turned on. Further, the flag set signal FLAGSET at the block address N goes high, whereby the node N110 goes low, and thereby the node N111 goes high. Consequently, the latch circuit LT110 is set, and the access flag is set, Namely, this is a state in which the latch circuit LT110 is set in this embodiment.

Thereafter, access flags held in the latch circuits LT110 are read from the latch circuits 110 of the row decoders 100 in all blocks and compared with their expected values (step S116). For example, when the block address N is "0", an access flag read from the latch circuit LT110 of the row decoder 100 at the block address "0" and a set (for example, "1") as its expected value are compared. Moreover, access flags read from the latch circuits LT110 of the row decoders 100 at block addresses other than "0" are compared with a reset (for example, "0") as their expected value. When the access flags of all the blocks match their expected values, a one-to-one correspondence is established between the block address N and the actual block.

Subsequently, whether the block address N is a last block address is determined (step S118). When the block address N is not the last block address (step S118: No), one is added to the block address N (step S120). Then, the latch circuits LT110 of all the blocks are reset again (step S122), and the aforementioned steps from step S114 are repeated. Specifically, by driving the flag reset signal RESET high as in the aforementioned step S110, the latch circuits LT110 are reset.

On the other hand, when it is determined in the aforementioned step S118 that the block address N is the last block address (step S118: Yes), this test process is completed. If all the access flags match their expected values as far as the last block address, the semiconductor memory device has a one-to-one correspondence between all block addresses and actual blocks.

Figure 6:
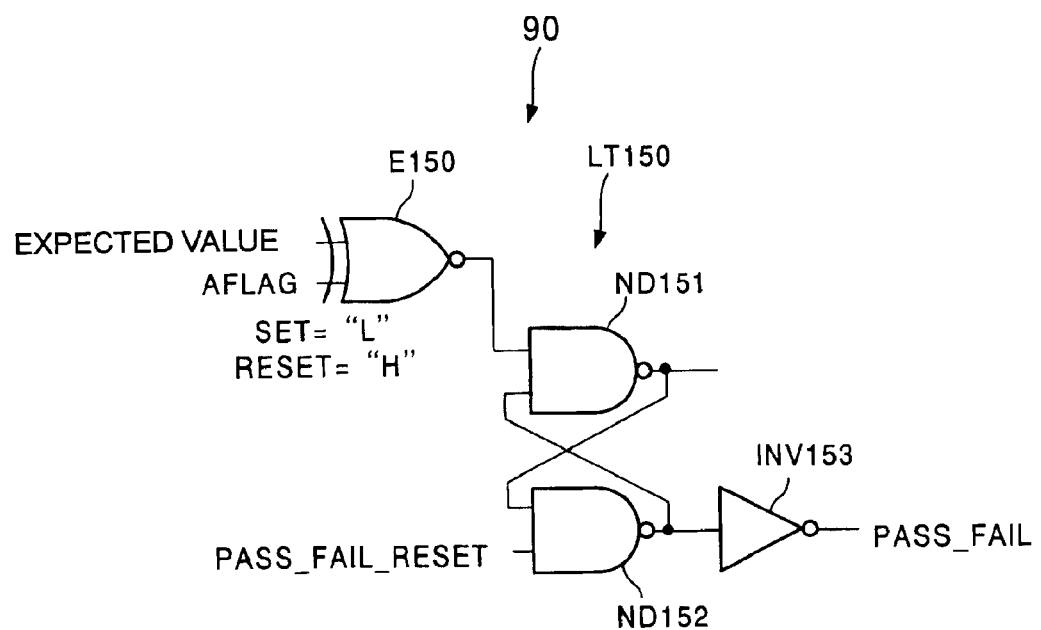
FIG. 6 is a diagram explaining an example of the circuit configuration of a test result determining circuit according to the first embodiment.

FIG. 6 is a diagram showing the configuration of a test result determining circuit 90 according to this embodiment. As shown in FIG. 6, the test result determining circuit 90 includes an EXOR circuit E150, NAND circuits ND151 and ND152, and an inverter circuit INV153. A latch circuit LT150 includes these NAND circuit ND151 and NAND circuit ND152.

An expected value signal and an access flag signal AFLAG indicating the contents of an access flag are inputted to the EXOR circuit E150. The flag sense signal SENSE in FIG. 4 goes high and the MOS transistor Tr142 is turned on, with the result that the access flag signal AFLAG is out putted via the MOS transistor Tr143.

The EXOR circuit E150 outputs a low when the expected value signal and the access flag signal AFLAG match, and outputs a high when they do not match. This output of the EXOR circuit 150 is inputted to the NAND circuit ND151.

The latch circuit LT150 holds the input from the EXOR circuit E150 and outputs it from the NAND circuit ND152. The output of the NAND circuit ND152 is inverted by the inverter circuit INV153 and outputted as a test result signal PASS_FAIL.

Figure 7:
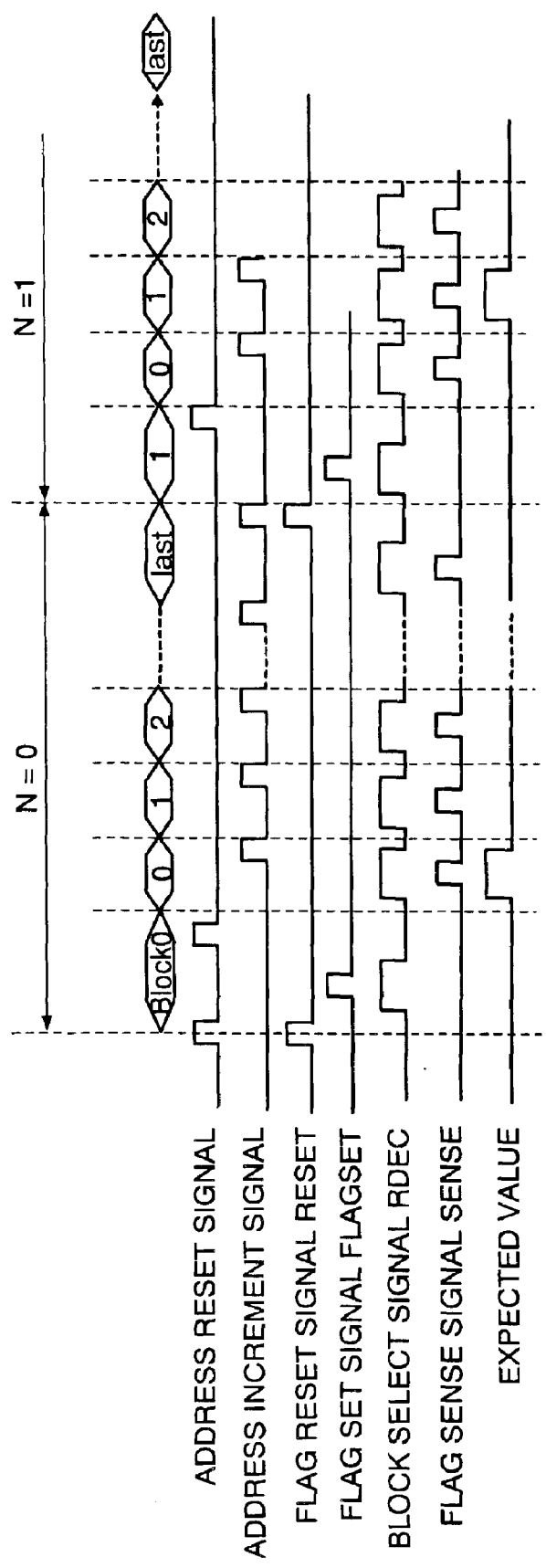
FIG. 7 is a diagram showing an example of operation waveforms of the test process in the semiconductor memory device according to the first embodiment.

FIG. 7 is a diagram showing an example of operation waveforms of the test process in the semiconductor memory device according to this embodiment. As shown in FIG. 7, in the test process, the block address N is set to "0" by an address reset signal, and access flags in all the latch circuits LT110 are reset by the flag reset signal RESET. Then, by driving the block select signal RDEC high and driving the flag set signal FLAGSET high, an access flag of a block selected by the block address N is set. At this time, if plural blocks are multi-selected due to a defect such as shorted wiring, two or more access flags are set. Moreover, if the block at the block address N cannot be selected due to a defect such as open wiring, the access flag at the block address N is not set.

Then, by driving an address increment signal in sequence and driving the flag sense signal SENSE high in sequence, access flags from the first block address N=0 to the last block address are read in sequence. These access flags are then compared with a signals indicating an expected value. For example, when the block address N is "0", the signal indicating the expected value goes high, and except that case, it is low.

As described above, according to the semiconductor memory device according to this embodiment, the time required for the test process can be shortened. Namely, it is determined based on access flags held in the latch circuits LT100 that the row decoder 100 corresponding to a block address is selected, and hence unlike the related art, it becomes unnecessary to access (read, write, erase) the memory cells MC in the memory cell array 10. Consequently, whether a one-to-one correspondence is established between block addresses and actual blocks can be determined without access to the memory cells MC, whereby the time required for the test processing can be shortened.

Second Embodiment

In the second embodiment, by putting restrictions on the number of times an access flag held in a latch circuit can be changed, the number of times the access flag is read is reduced to one throughout the test process. Namely, first, access flags of all blocks are reset, then the access flag is set when the first access is made, and the access flag is reset when the second access is made, but the access flag cannot be set again in and after the third access. Further details will be given below.

Figure 8:
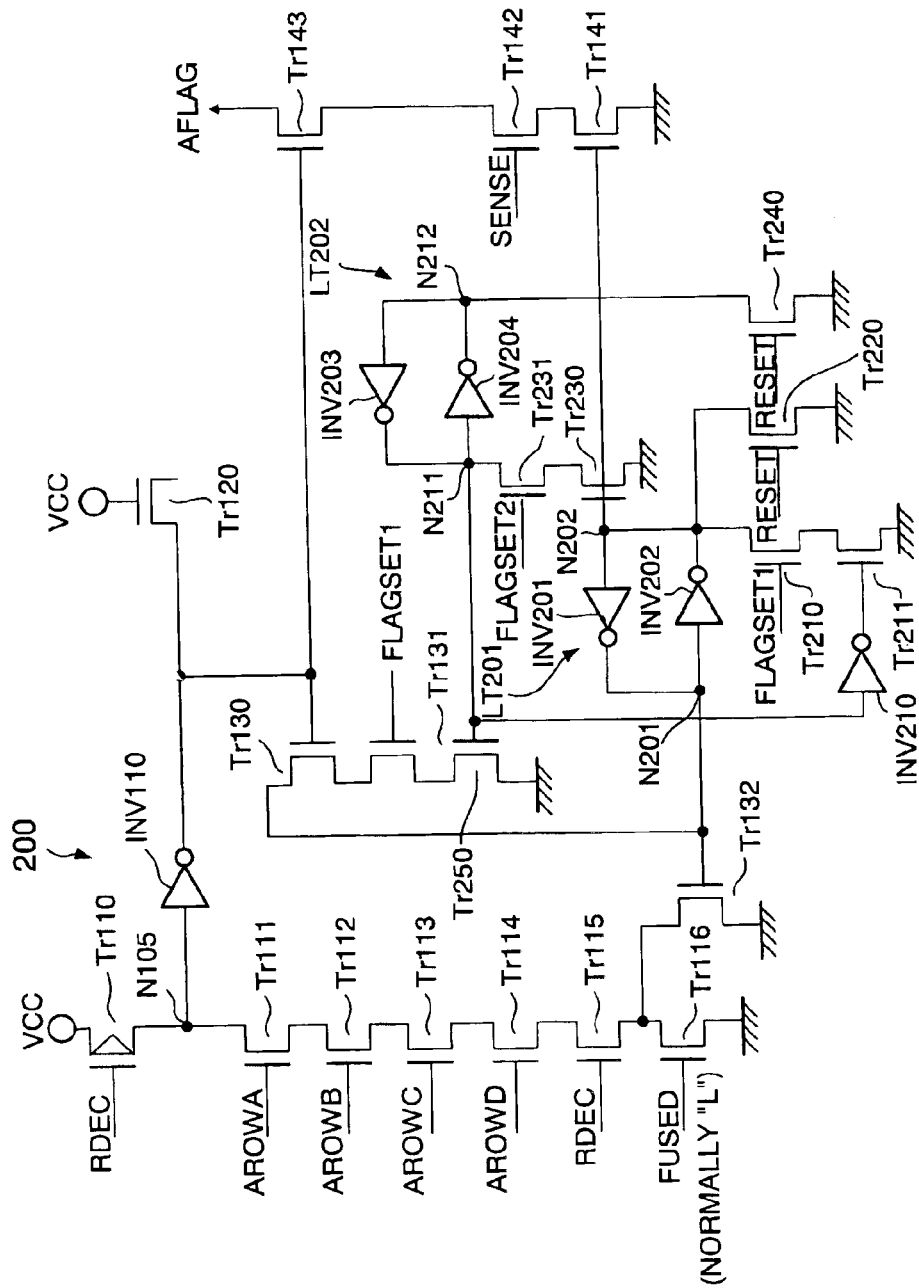
FIG. 8 is a diagram explaining an example of the circuit configuration of a row decoder according to a second embodiment.

FIG. 8 is a diagram showing a row decoder 200 provided in the row decoder circuit 20 according to this embodiment. The row decoder 200 configured as shown in FIG. 8 is provided corresponding to each block. In other words, the row decoder circuit 20 includes plural row decoders 200. FIG. 8 is a diagram corresponding to FIG. 4 in the aforementioned first embodiment. It should be noted that the entire configuration of a semiconductor memory device according to this embodiment is the same as that in the aforementioned first embodiment.

As shown in FIG. 8, the row decoder 200 according to this embodiment includes two latch circuits LT201 and LT202. The first latch circuit LT201 includes an inverter circuit INV201 and an inverter circuit INV202. A node N201 which is an input of the inverter circuit INV202 is connected to a gate of the MOS transistor Tr132. A node 202 which is an input of the inverter circuit INV201 is connected to an N-type MOS transistor Tr210 and an N-type MOS transistor Tr220.

A first flag set signal FLGSET1 is inputted to a gate of the MOS transistor Tr210. An N-type MOS transistor Tr211 is connected in series with the MOS transistor Tr210. The flag reset signal RESET is inputted to a gate of the MOS transistor Tr220.

The node N202 is also connected to the gate of the N-type transistor Tr141 and a gate of an N-type MOS transistor Tr230. An N-type MOS transistor Tr231 is connected in series with the MOS transistor Tr230. A second flag set signal FLAGSET2 is inputted to a gate of the MOS transistor Tr231. The MOS transistor Tr231 is connected to a node N211 of the second latch circuit LT202.

The second latch circuit LT202, similarly to the first latch circuit LT201, includes two inverter circuits INV203 and INV204. The node N211 is connected to an input of the inverter circuit INV204. An output of the inverter circuit INV204 is connected to a node N212. The node N212 is connected to an N-type MOS transistor Tr240. The flag reset signal RESET is inputted to a gate of the MOS transistor Tr240.

Moreover, the node N211 is connected to the gate of the MOS transistor Tr211 via an inverter circuit INV210. The node N211 is connected to a gate of an N-type MOS transistor Tr250. The MOS transistor Tr250 is connected in series with the MOS transistor Tr131.

In the row decoder shown in FIG. 8, both the first latch circuit LT201 and the second latch circuit LT202 are reset in the first place. When the first access to the row decoder 200 is made, the first latch circuit LT201 and the second larch circuit LT202 are set, and when the second access is made, the first latch circuit LT201 is reset, and the second latch circuit LT201 remains set. In and after the third access, no matter how many accesses are made, the states of the first latch circuit LT201 and the second latch circuit LT202 are unchanged. Namely, the first latch circuit LT210 remains reset, and the second latch circuit LT202 remains set. By setting up such a condition, whether only one access is made to the row decoder 200 can be determined by only reading the set/reset state of the first latch circuit LT201 as an access flag.

Figure 9:
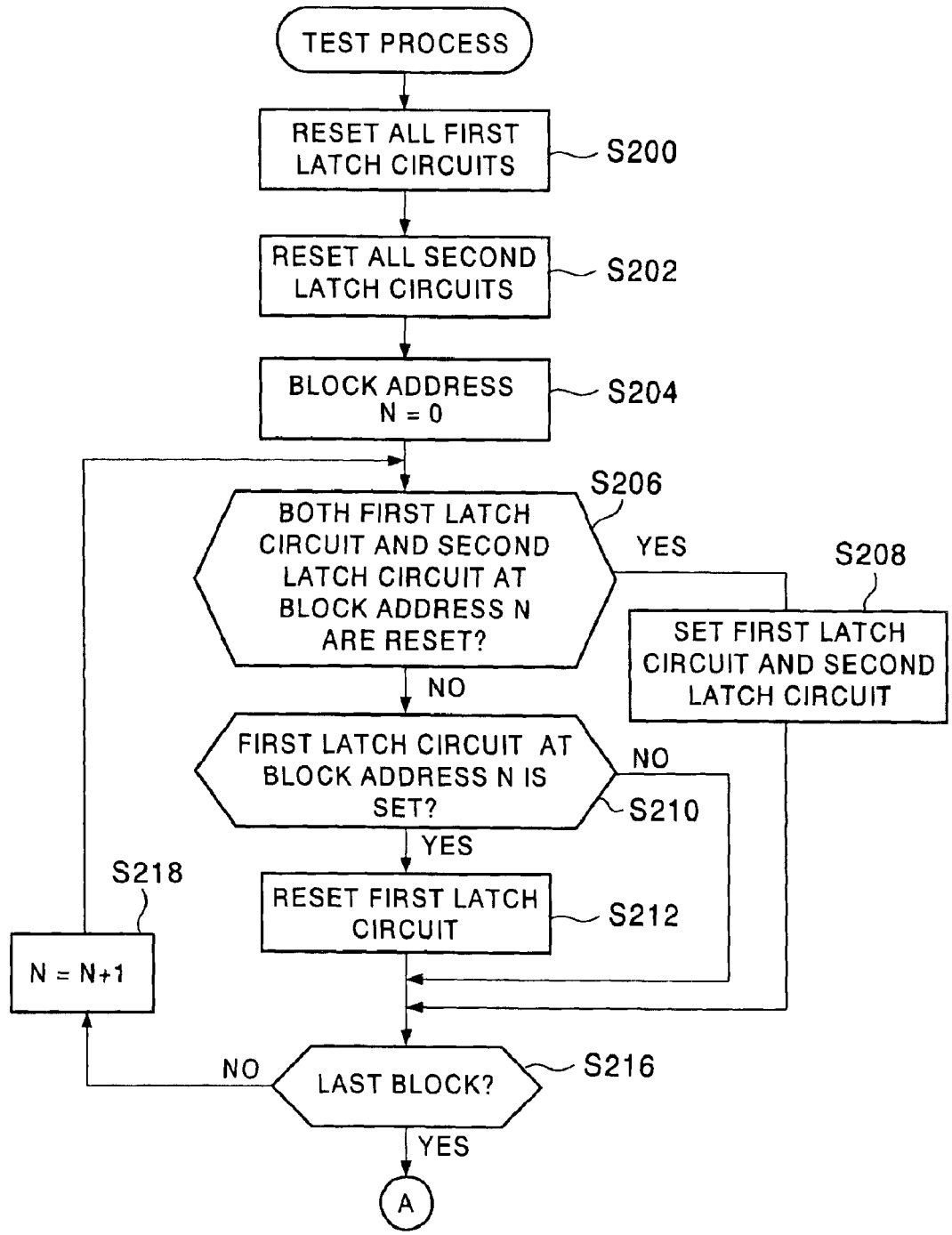
FIG. 9 is a diagram explaining an example of a test process of a semiconductor memory device according to the second embodiment (First process)
Figure 10:
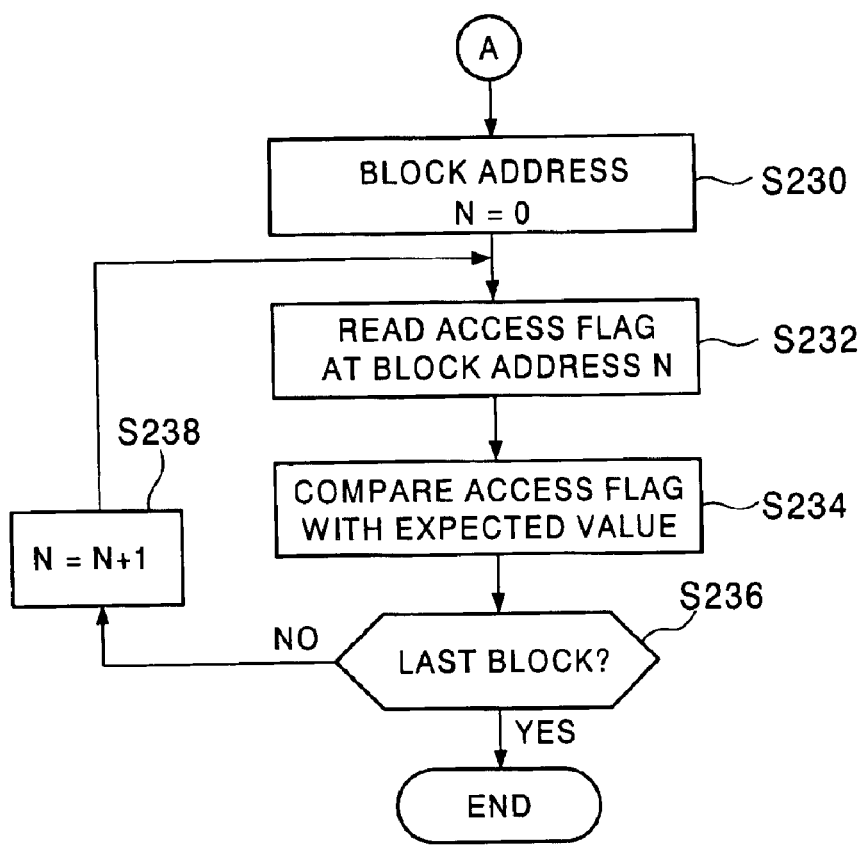
FIG. 10 is a diagram explaining the example of the test process of the semiconductor memory device according to the second embodiment (Second process)

FIG. 9 and FIG. 10 are flowcharts explaining a test process of testing whether a one-to-one correspondence is established between block addresses and actual blocks in the semiconductor memory device according to this embodiment.

As showing in FIG. 9, first, all the first latch circuits LT201 of the row decoders 200 provided in respective blocks are reset (step S200), and all the second latch circuits LT202 thereof are reset (step S202). Specifically, the flag reset signal RESET is driven high to turn the MOS transistor Tr240 and the MOS transistor Tr220 on. Consequently, the node N202 of the first latch circuit LT201 goes low, and the node N201 thereof goes high. Moreover, the node N212 of the second latch circuit LT202 goes low, and the node N211 thereof goes high.

Secondly, the block address N is reset to "0" (step S204). Thirdly, whether both the first latch circuit LT201 and the second latch circuit LT202 at the block address N are reset is determined (step S206), and when both of them are reset (step S206: Yes), the first latch circuit LT201 and the second latch circuit LT202 are set (step S208). In the case of "No" in step S206, whether the first latch circuit LT201 at the block address N is set is determined (step S210).

When the first latch circuit LT201 is set (step S210: Yes), the first latch circuit LT201 is reset (step S212). On the other hand, in the case of "No " in step S210, the first latch circuit LT201 is not set.

Specifically, when an access to the row decoder 200 at the block address N is made, after the first flag set signal FLAGSET1 changes from low level to high level and then low level, the second flag set signal FLAGSET2 changes from low level to high level and then low level.

In the first access, the first flag set signal FLAGSET1 goes high, whereby the MOS transistor Tr131 is turned on, and the node N211 is high. Consequently the node N201 of the first latch circuit LT201 goes low and the node N202 thereof goes high. Incidentally, even when the first flag set signal FLAGSET1 goes high, the MOS transistor Tr211 remains off since the node N211 is high.

Subsequently, the second flag set signal FLAGSET2 goes high, whereby the MOS transistor Tr231 is turned on, and the node N202 is high. Consequently the node N211 of the second latch circuit LT202 goes low and the node N212 thereof goes high.

In the second access, the first flag set signal FLAGSET1 goes high, whereby the MOS transistor Tr210 is turned on, and the node N211 is low. Consequently, the MOS transistor Tr211 is turned on. Hence, the node N202 of the first latch circuit LT201 goes low and the node N201 thereof goes high. Even if the MOS transistor Tr131 is turned on at this time, the MOS transistor Tr250 remains off since the node N211 is low.

Subsequently, the second flag set signal FLAGSET2 goes high, whereby the MOS transistor Tr231 is turned on, but the node N202 is low, and consequently the MOS transistor Tr230 is off. Hence, the node N211 of the second latch circuit LT202 remains low.

In and after the third access, the first flag set signal FLAGSET1 goes high, whereby the MOS transistor Tr131 is turned on, but since the node N211 is low, the MOS transistor Tr250 remains off. Moreover, even if both the MOS transistors Tr210 and Tr211 are turned on, the node N202 remains low. Hence, the node N201 of the first latch circuit LT201 remains high and the node N202 thereof remains low. Moreover,the second flag set signal FLAG-SET2 goes high, whereby the MOS transistor Tr231 is turned on, but since the node N202 is low, the MOS transistor Tr230 is off. Hence, the node N211 of the second latch circuit LT202 remains low.

Next, whether the block address N is the last block address is determined (step S216). When the block address N is not the last block address (step S216: No), one is added to the block address N (step S218). Then, the aforementioned steps from step S206 are repeated.

On the other hand, when the block address N is the last block address (step S216: Yes), the block address N is reset to "0" as shown in FIG. 10 (step S230).

Thereafter, an access flag is read from the first latch circuit LT201 in the row decoder 200 at the block address N (step S232). Then, whether the read access flag matches its expected value is determined (step S234).

Subsequently, whether the block address N is the last block address is determined (step S236). When the block address N is not the last block address (step S236: No), one is added to the block address N, and the aforementioned steps from step S232 are repeated.

On the other hand, when the block address N is the last block address, this test process is completed. If the latch circuits LT201 corresponding to all block addresses hold access flags indicating only one access, the semiconductor memory device has a one-to-one correspondence between block addresses and actual blocks appropriately. In other words, the nodes N201 of all the latch circuits LT201 have only to be held low.

The configuration of a test result determining circuit which determines whether a read access flag and its expected value match is the same as that in FIG. 6 in the aforementioned first embodiment. Accordingly, the flag sense signal SENSE goes high, with the result that the access flag held in the first latch circuit LT201 is read as the access flag signal AFLAG from the MOS transistor Tr143. Then whether it matches its expected value is determined by the test result determining circuit 90.

Figure 11:
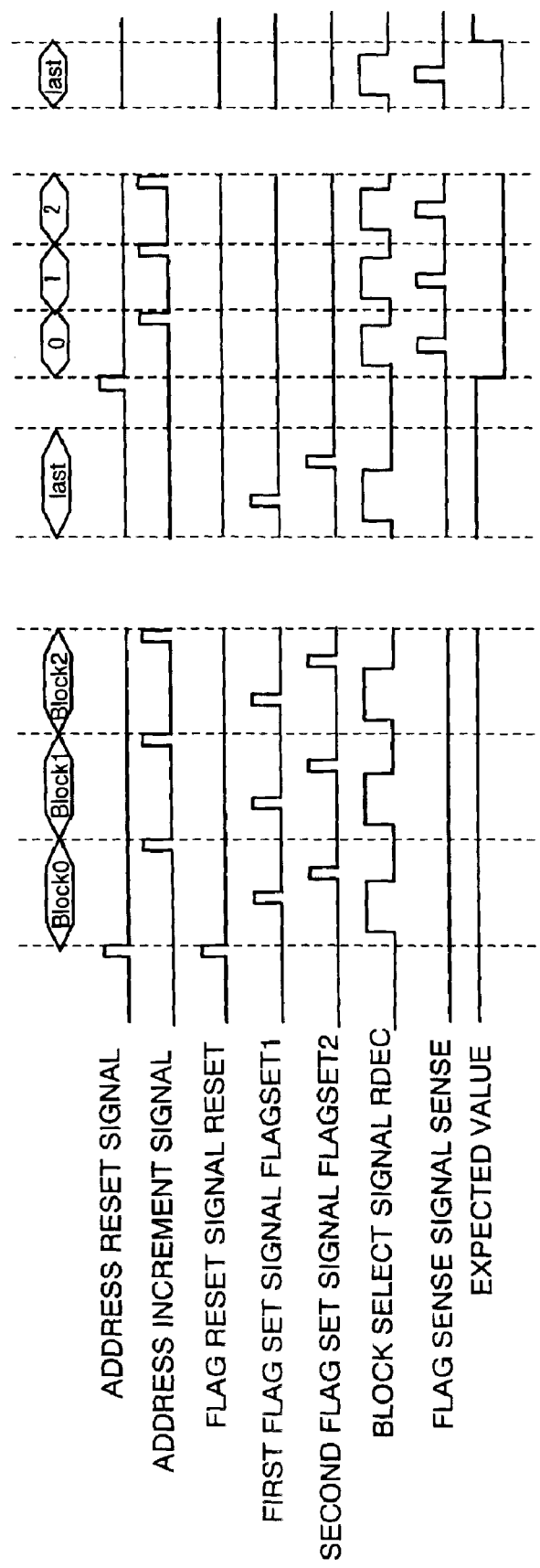
FIG. 11 is a diagram showing an example of operation waveforms of the test process in the semiconductor memory device according to the second embodiment.

FIG. 11 is a diagram showing an example of operation waveforms of the test process in the semiconductor memory device according to this embodiment. As shown in FIG. 11, in the test process, first, the block address N is reset to "0" by the address reset signal, and all access flags are reset by the flag reset signal RESET. Then, by driving the block select signal RDEC high and driving the first flag set signal FLAGSET1 and the second flag set signal FLASET2 high in sequence, an access flag in a block selected by the block address N is set/reset as described above. At this time, if plural blocks are multi-selected due to a defect such as shorted wiring, two or more row decoders 200 are accessed. Moreover, if the block at the block address N cannot be selected due to a defect such as open wiring, the row decoder 200 is not accessed.

Then, by performing such an operation while driving the address increment signal in sequence, access flags from the first block address N=0 to the last block address are set.

Thereafter, the address reset signal is driven high and the block address N is reset to "0". The flag sense signal SENSE is driven high from the block address "0" in sequence to read access flags held in the first latch circuits LT201. The expected values at this time are "set" (the node N201 is low in this example) in all blocks.

As described above, according to the semiconductor memory device according to this embodiment, the time required for the test process can be shortened. Namely, it is determined based on the access flag held in the first latch circuit LT201 that only one access is made to the row decoder 200 corresponding to a block address, and hence unlike the related art, it becomes unnecessary to access (read, write, erase) the memory cells MC in the memory cell array 10. Consequently, whether a one-to-one correspondence is established between block addresses and actual blocks can be determined without access to the memory cells MC, whereby the time required for the test processing can b shortened.

Moreover, according to this embodiment, in the test process, the number of times the access flag is read from the latch circuit LT201 can be once in each block, whereby the number of times the access flag is read from the latch circuit can be reduced compared with the aforementioned first embodiment. As a result, the time required for the test processing can be further shortened.

Third Embodiment

In the third embodiment, one block access determining circuit which determines whether only one block is accessed is added to the row decoder 100 in the aforementioned first embodiment. Such a one block access determining circuit is also disclosed in Japanese Patent Laid-open No. 2002-133898. Further details will be given below.

Figure 12:
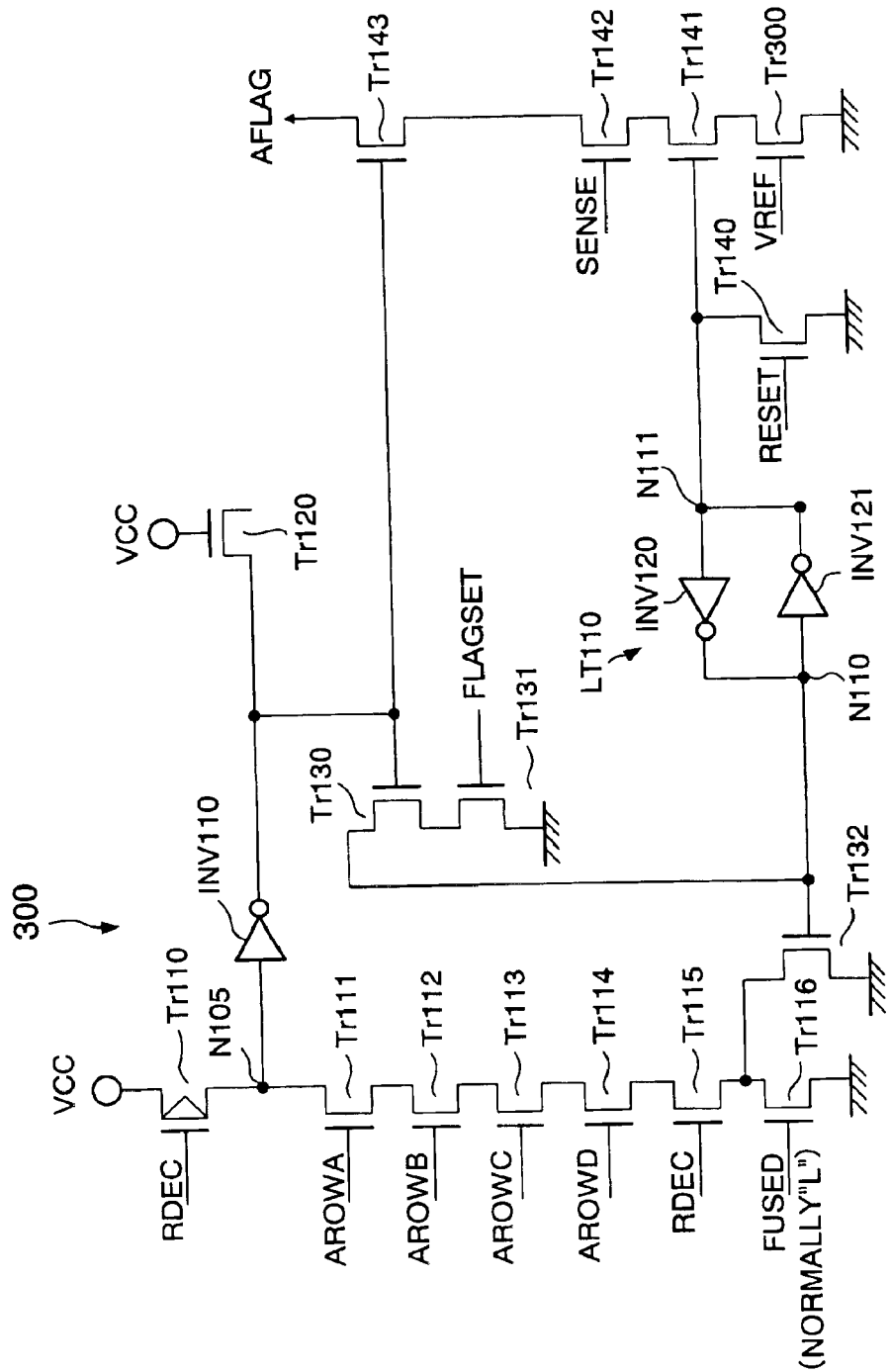
FIG. 12 is a diagram explaining an example of the circuit configuration of a row decoder according to a third embodiment.

FIG. 12 is a diagram showing the circuit configuration of a row decoder 300 according to this embodiment, and corresponds to FIG. 4 in the first embodiment. As shown in FIG. 12, the row decoder 300 according to this embodiment is configured by adding an N-type MOS transistor Tr300 to the row decoder 100 according to the first embodiment. Namely, the MOS transistor Tr300 is added in series between the MOS transistor Tr141 and a ground. A reference voltage VREF is applied to a gate of the MOS transistor Tr300.

Figure 13:
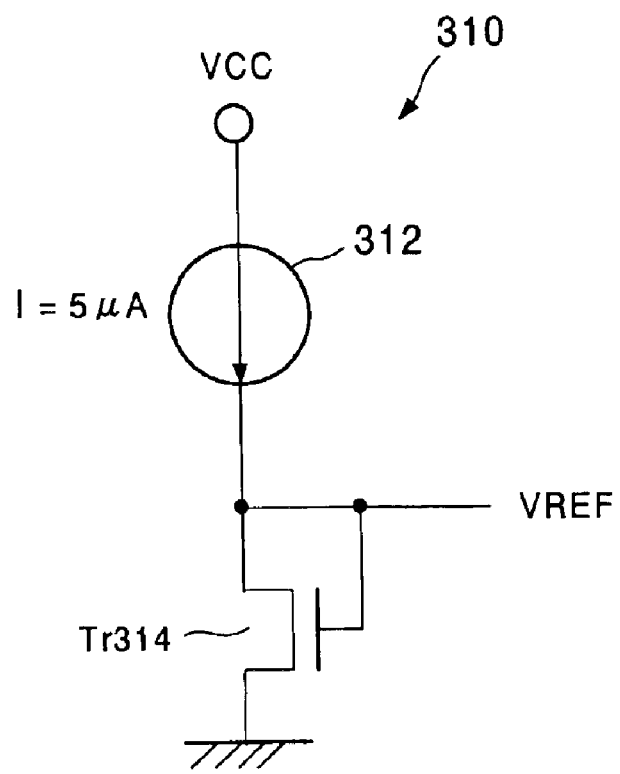
FIG. 13 is a diagram explaining the circuit configuration of a reference voltage generating circuit according to a third embodiment.

FIG. 13 is a diagram showing an example of a reference voltage generating circuit 310 which generates the reference voltage VREF. As shown in FIG. 13, the reference voltage generating circuit 310 according to this embodiment includes a constant current circuit 312 and an N-type MOS transistor Tr314. The constant current circuit 312 is a circuit which generates, for example, a constant current of 5 $\mu$A. A gate and a drain of the MOS transistor Tr314 are connected in common, and the reference voltage VREF is outputted from a node to which they are connected in common.

Figure 14:
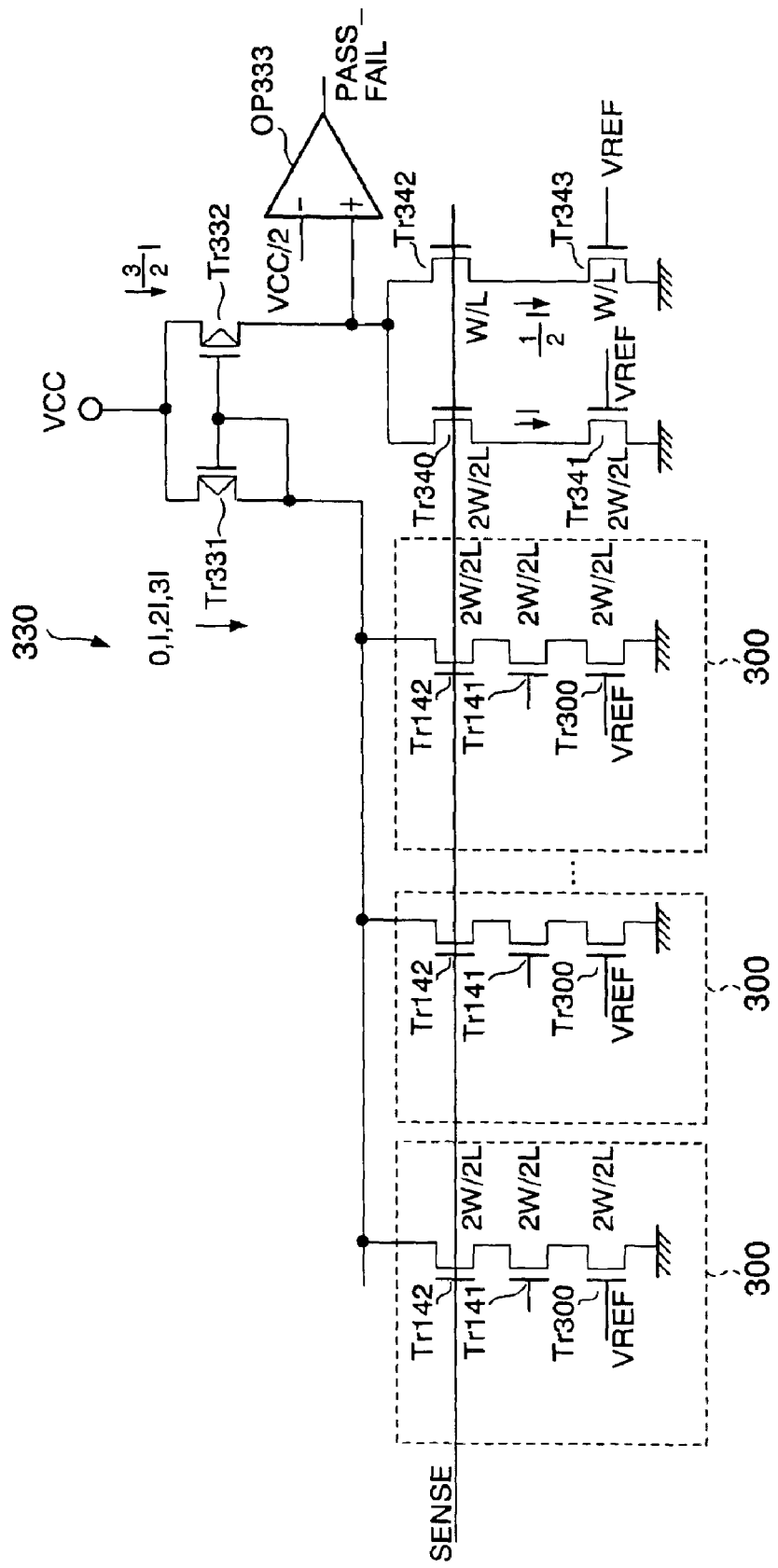
FIG. 14 is a diagram explaining the circuit configuration of a one block access determining circuit according to the third embodiment.

FIG. 14 is a diagram showing the configuration of a one block access determining circuit 330 according to this embodiment. As shown in FIG. 14, the one block access determining circuit 330 according to this embodiment includes P-type MOS transistors Tr331 and Tr332, N-type MOS transistors Tr340 to Tr343, and an operational amplifier OP333.

A source of the MOS transistor Tr331 and a source of the MOS transistor Tr332 are connected to a supply voltage VCC. Moreover, gates of these MOS transistor Tr331 and MOS transistor Tr332 are connected to each other to constitute a current mirror circuit. A drain of the MOS transistor Tr331 is connected to its own gate. Namely, the MOS transistor Tr331 functions as a diode.

The drain of the MOS transistor Tr331 is connected to a drain of the MOS transistor Tr142 of the row decoder 300 provided corresponding to each block. In FIG. 14, the MOS transistor Tr331 is connected to the row decoders 300 of all blocks.

A drain of the MOS transistor Tr332 is connected to a drain of the MOS transistor Tr340, a drain of the MOS transistor Tr342, and a positive side input terminal of the operational amplifier OP333. Half the voltage of the supply voltage VCC is supplied to a negative side input terminal of the operational amplifier OP333.

The flag sense signal SENSE is inputted to a gate of the MOS transistor Tr340 and a gate of the MOS transistor Tr342. The MOS transistor Tr341 is connected in series with the MOS transistor Tr340, and the MOS transistor Tr343 is connected in series with the MOS transistor Tr342. The reference voltage VREF is inputted to a gate of the MOS transistor Tr341 and a gate of the MOS transistor Tr343.

Here the following configuration is assumed. If the gate width and the gate length of the MOS transistors Tr342 and Tr343 are taken here as W and L respectively, the gate width and the gate length of the MOS transistors Tr340 and Tr341 are 2W and 2L, respectively. Similarly, the gate width of the MOS transistors Tr141, Tr142, and Tr300 is 2W, and the gate length thereof is 2L.

If the current flowing through the MOS transistor Tr341 is taken as I in the above configuration, the current flowing through the MOS transistor Tr343 is 1/2×I. Similarly, the current flowing through the MOS transistors Tr141, Tr142, and Tr300 is also I.

Accordingly, when the flag sense signal SENSE is high, the current which tries to flow through the MOS transistor Tr332 is 3/2×I. For example, here, if in the test process, the row decoder 300 is normally accessed and only the MOS transistor Tr141 of one row decoder 300 is turned on, the current flowing through the MOS transistor Tr331 is I. If the MOS transistors Tr141 of two row decoders 300 are turned on for some reason, the current flowing through the MOS transistor is 2×I, and if the MOS transistors Tr141 of three row decoders 300 are turned on, the current flowing through the MOS transistor Tr331 is 3×I. On the other hand, if no row decoder 300 is accessed, the current flowing through the MOS transistor Tr331 is 0. As described above, the current flowing through the MOS transistor Tr331 changes depending on the number of accessed row decoders. This change of the current flowing through the MOS transistor Tr331 is read as voltage change by the operational amplifier OP333 via the MOS transistor Tr332 connected in a current mirror configuration. The operational amplifier OP333 outputs this result as a test result signal PASS_FAIL.

In the example in FIG. 14, the operational amplifier OP333 outputs the test result signal PASS_FAIL indicating a pass when the number of the accessed row decoder 300 is zero or one, and outputs the test result signal PASS_FAIL indicating a failure when the number of the accessed row decoders 300 is two or more.

As can be seen from the above, the circuit in FIG. 14 cannot detect that the number of the accessed row decoders 300 is zero. Hence, in this embodiment, a test process such as shown in FIG. 15 and FIG. 16 is executed.

Figure 15:
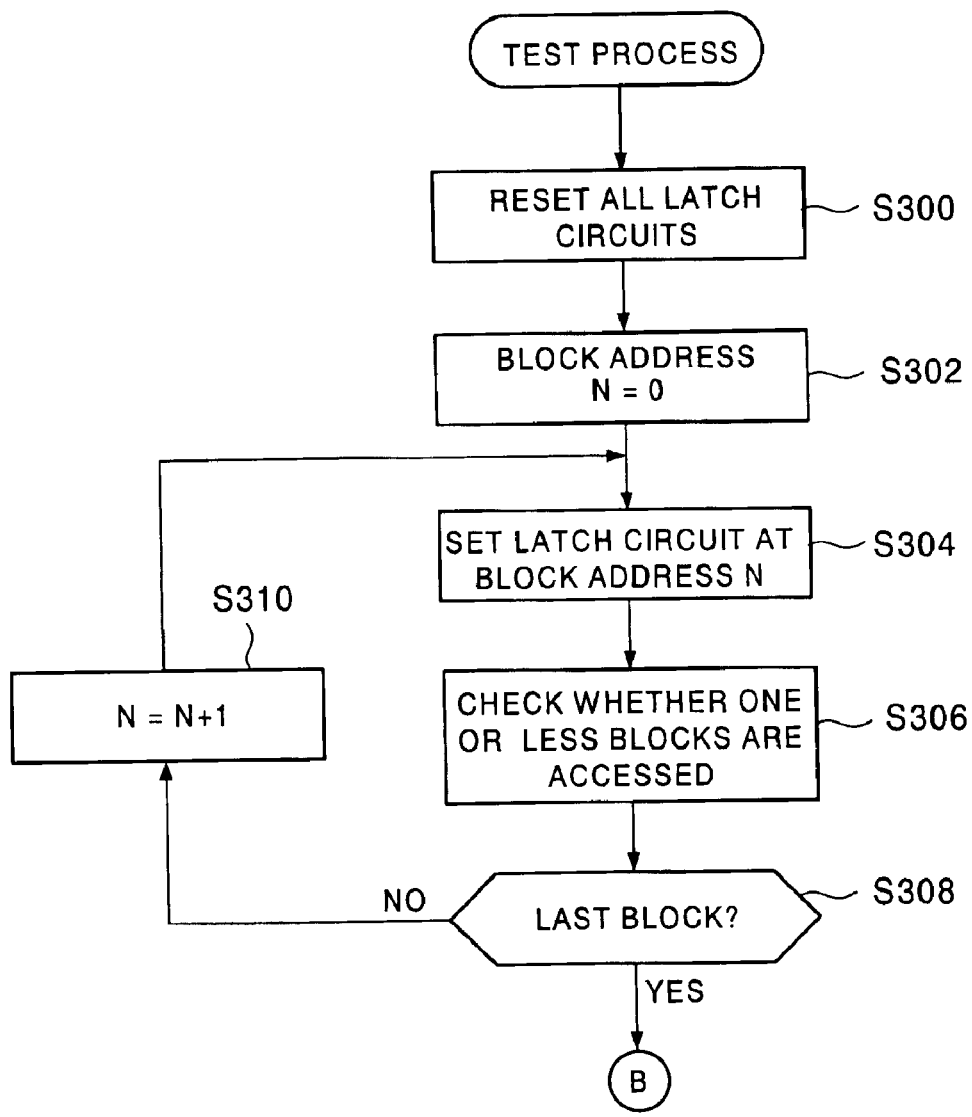
FIG. 15 is a diagram explaining an example of a test process of a semiconductor memory device according to the third embodiment (First process)
Figure 16:
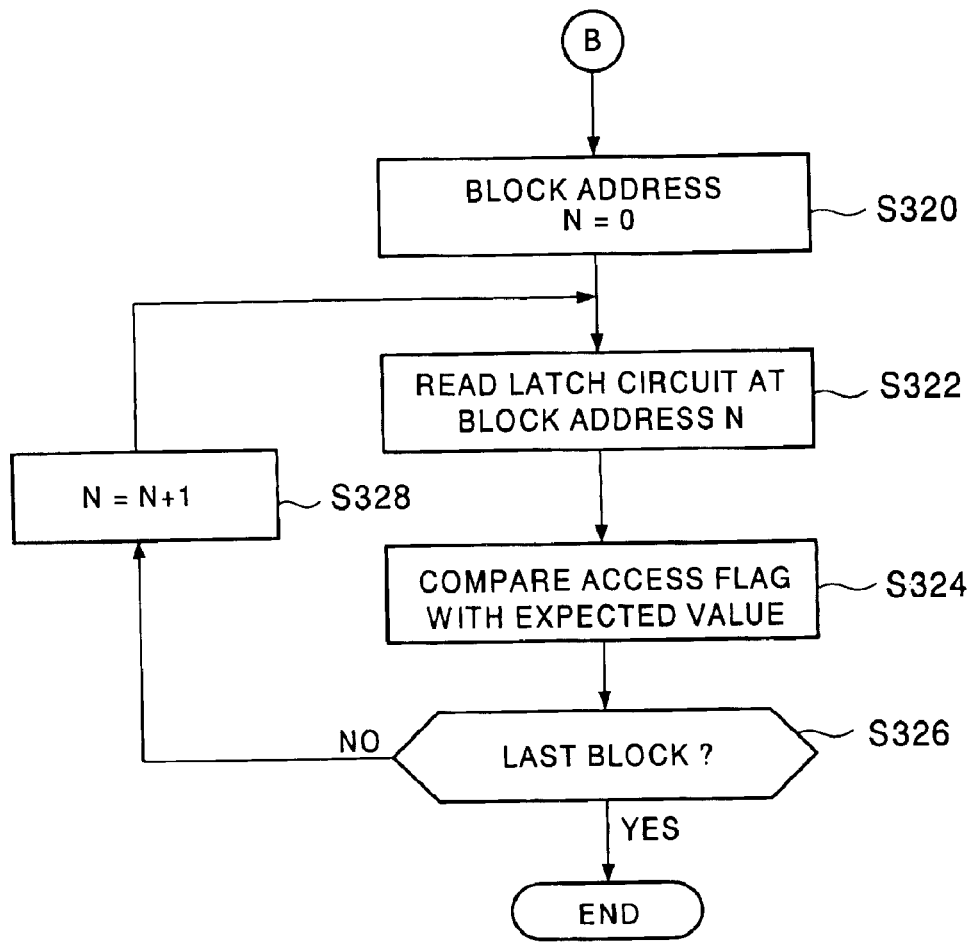
FIG. 16 is a diagram explaining the example of the test process of the semiconductor memory device according to the third embodiment (Second process)
Figure 17:
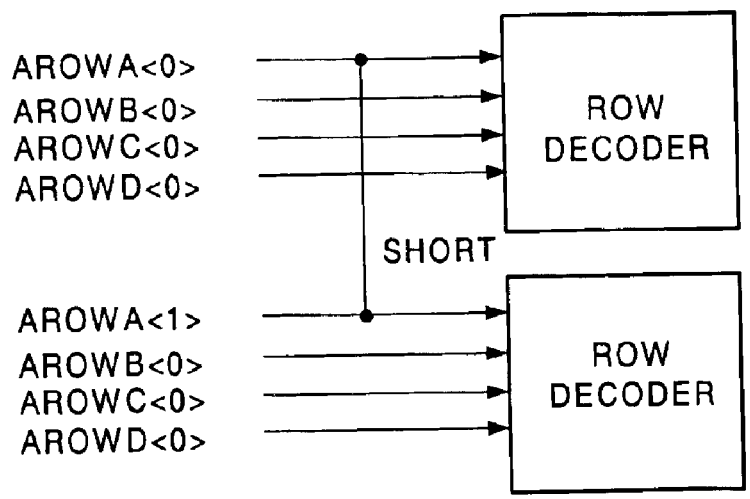
FIG. 17 is a diagram explaining a state in which plural row decoders are selected because signal lines are shorted.
Figure 18:
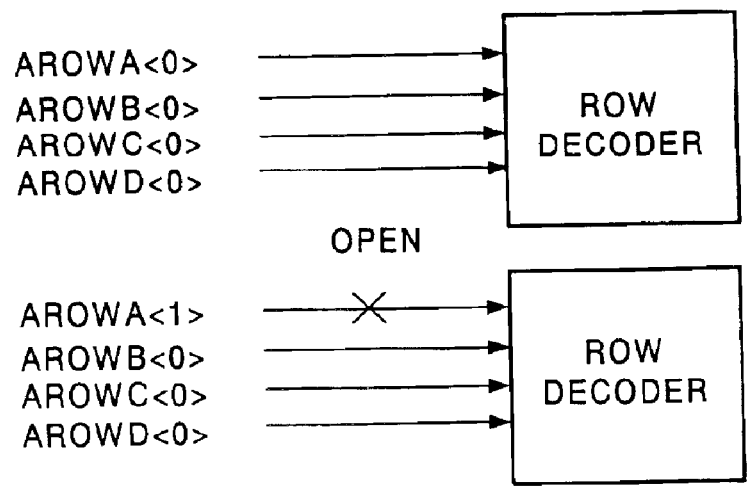
FIG. 18 is a diagram explaining a state in which no row decoder is selected because a signal line is opened.
Figure 19:
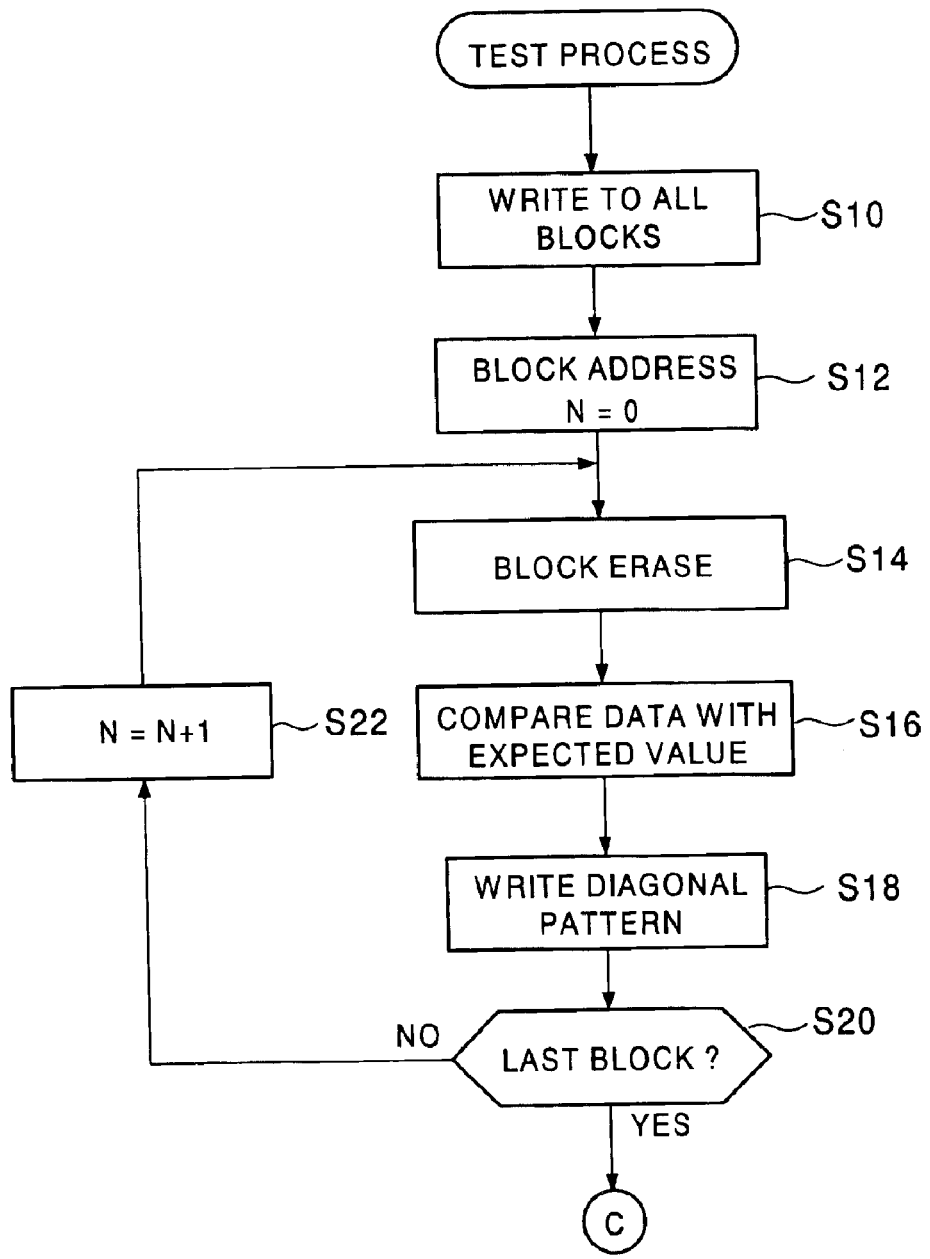
FIG. 19 is a diagram explaining a test process of a related semiconductor memory device (First process)
Figure 20:
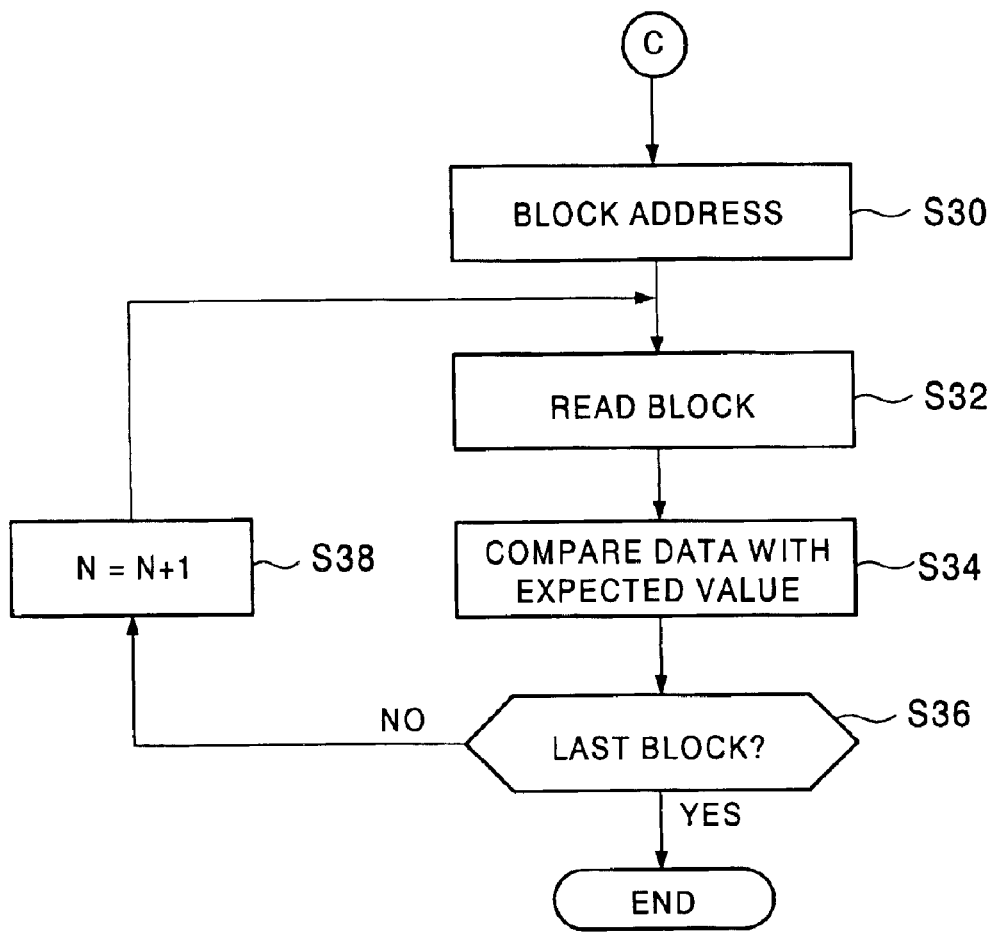
FIG. 20 is a diagram explaining the test process of the related semiconductor memory device (Second process)
Figure 21:
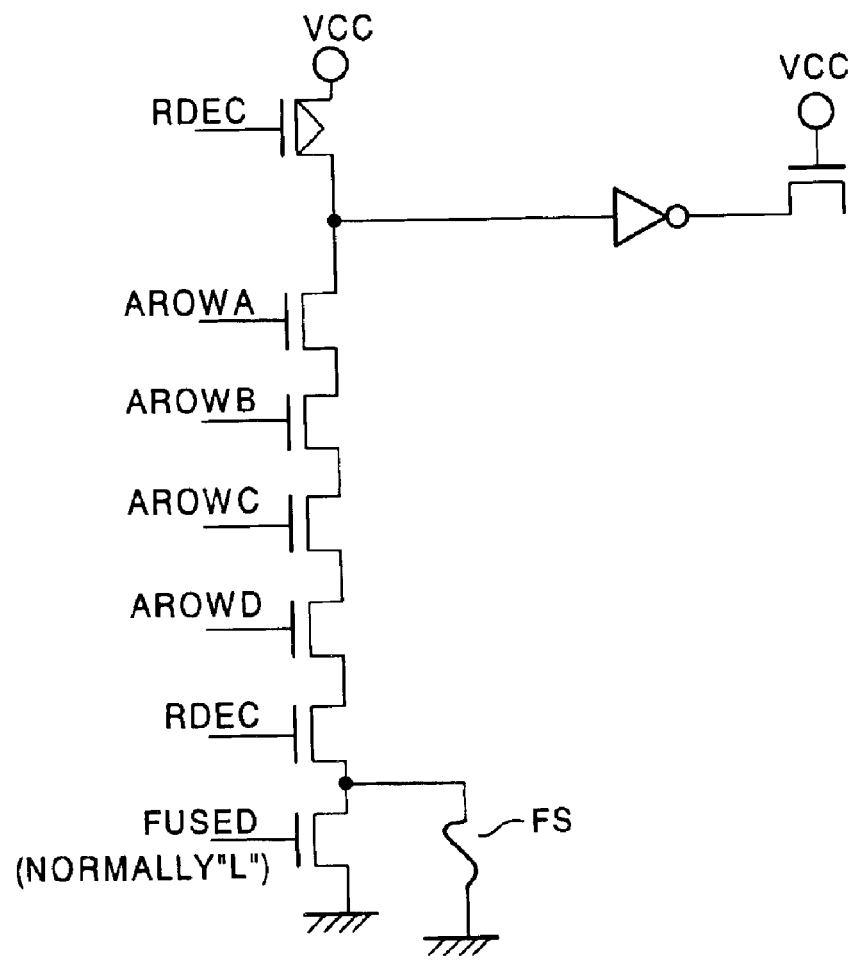
FIG. 21 is a diagram explaining an example of the circuit configuration of a related row decoder.
Figure 22:
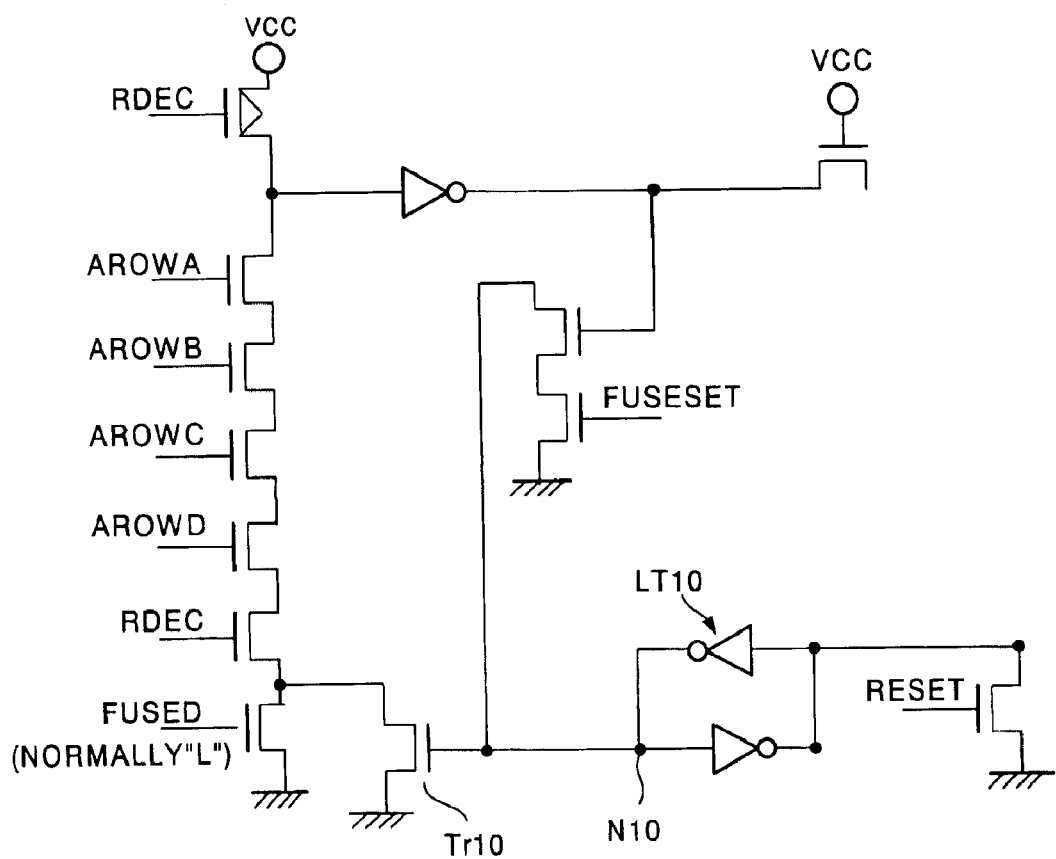
FIG. 22 is a diagram explaining an example of the circuit configuration of another related row decoder.

FIG. 15 and FIG. 16 are flowcharts explaining a test process of testing whether a one-to-one correspondence is established between block addresses and actual blocks in a semiconductor memory device according to this embodiment.

As showing in FIG. 15, first, all the first latch circuits LT110 of the row decoders 300 provided in respective blocks are reset (step S300).

Then, the block address N is reset to "0" (step S302). Subsequently, an access flag is set by setting the latch circuit LT110 in the row decoder 300 at the block address N (step S304).

Thereafter, whether one or less row decoders 300 are accessed is determined by using the one block access determining circuit 330 (step S306).

Next, whether the block address N is the last block address is determined (step S308). when the block address N is not the last block address (step S308: No), one is added to the block address N (step S310). Then, the aforementioned steps from step S304 are repeated.

On the other hand, when it is determined in the aforementioned step S308 that the block address N is the last block address (step S308: Yes), the block address N is reset to "0" as shown in FIG. 16 (step S320). Thereafter, an access flag is read from the latch circuit LT110 in the row decoder 300 at the block address N (step S322).

Then, the read access flag is compared with its expected value (step S324). Namely, whether the access flag indicates that there is access is determined. If the access flag indicates that there is no access, the corresponding block is not accessed in the aforementioned process from step S300 to step S310.

Subsequently, whether the block address N is the last block address is determined (step S326). When the block address N is not the last block address (step S326: No), one is added to the block address N (step S328). Then, the aforementioned steps from step S322 are repeated.

On the other hand, when it is determined in the aforementioned step S326 that the block address N is the last block address (step S326: Yes), this test process is completed. When it is determined by the check in step S306 that one or less blocks are accessed, and also it is determined by the comparison in step S324 that every block is accessed, the semiconductor memory device has a one-to-one correspondence between block addresses and actual blocks.

As described above, according to the semiconductor memory device according to this embodiment, the time required for the test process can be shortened. Namely, it is determined based on access flags held in the latch circuits LT110 that one or less row decoders 300 are selected and that any row decoder which is not accessed does not exist, and hence unlike the related art, it becomes unnecessary to access (read, write, erase) the memory cells MC in the memory cell array 10. Consequently, whether a one-to-one correspondence is established between block addresses and actual blocks can be determined without access to the memory cells MC, whereby the time required for the test processing can b shortened.

Moreover, according to this embodiment, the number of times the access flags are read from the latch circuits LT110 in respective blocks is the number of all blocks×2, whereby the number of times the access flags are read can be reduced compared with the aforementioned first embodiment.

It should be mentioned that the present invention is not limited to the aforementioned embodiments, and various changes may be made therein. For example, although in the aforementioned embodiments, the case where the semiconductor memory device is a NAND-type nonvolatile semiconductor memory device is explained as an example, the present invention can be applied to other kinds of semiconductor memory devices.

Moreover, the circuit configuration shown in the aforementioned embodiments is an example, and an equivalent function may be realized by some other circuit which operates in the same manner.

What is claimed is:

1. A semiconductor memory device, comprising:
    a memory cell array divided into a plurality of blocks, each of which includes a plurality of memory cells;
    a plurality of row decoders which correspond to the blocks, each of the row decoders including an access information holder configured to hold access information indicating whether its corresponding row decoder has been accessed; and
    an access information reader configured to read the access information held in the access information holders.

2. The semiconductor memory device according to claim 1, further comprising a first determination circuit configured to determine whether the row decoder to be accessed based on a designated block address has been accessed.

3. The semiconductor memory device according to claim 1, further comprising a second determination circuit configured to determine whether the row decoders other than the row decoder to be accessed based on a designated block address have been accessed.

4. The semiconductor memory device according to claim 1, further comprising a third determination circuit configured to determine whether the row decoder to be accessed based on a designated block address has been accessed and whether the row decoders other than the row decoder to be accessed based on the designated block address have been accessed.

5. The semiconductor memory device according to claim 4, wherein the third determination circuit comprises a plurality of test result determining circuits which correspond to the blocks,
    each of the test result determining circuits compares the access information which is read by the access information reader with expected access information which is a theoretical expected value concerning access information specified based on the designated block address, and
    each of the test result determining circuits outputs a test result signal indicating whether the access information matches with the expected access information.

6. The semiconductor memory device according to claim 1, wherein the access information held in the respective access information holders are allowed to be collectively reset by a reset signal.

7. The semiconductor memory device according to claim 1, wherein the access information holder is allowed to hold information that only one access has been made as the access information.

8. The semiconductor memory device according to claim 1, wherein the access information holder holds a first state in which no access has been made, a second state in which only one access has been made, and a third state in which two or more accesses have been made, as the access information.

9. The semiconductor memory device according to claim 1, wherein the access information holder comprises a latch circuit which shifts to a set state when being accessed once from a reset state, and shifts to a second reset state when being accessed once more from the set state, but does not shift to the set state even if it is accessed once more in the second reset state.

10. The semiconductor memory device according to claim 1, further comprising a fourth determination circuit configured to read the access information from the access information holders of all the row decoders and determine whether the row decoders corresponding to two or more blocks have been accessed.

11. The semiconductor memory device according to claim 10, wherein the fourth determination circuit comprises:
    a first current generating circuit configured to generate a first current which is proportional to the number of the blocks had been accessed;
    a second current generating circuit configured to generate a second current between a current flowing when one block has been accessed and a current flowing when two blocks have been accessed; and
    a comparison circuit configured to compare the first current with the second current.

12. The semiconductor memory device according to claim 11, wherein the comparison circuit outputs a test result signal indicating a test pass when the first current is smaller than the second current, and outputs a test result signal indicating a teat failure when the first current is larger than the second current.

13. The semiconductor memory device according to claim 12, wherein the access information is read from the access information holders of all the row decoders and whether any block which has not accessed exists is determined.

14. A test method of a semiconductor memory device which comprises: a memory cell array divided into a plurality of blocks each of which including a plurality of memory cells; and a plurality of row decoders which correspond to the blocks, each of the row decoders including an access information holder configured to hold access information indicating whether its corresponding row decoder has been accessed, the test method comprising:
    designating a block address and accessing the row decoder which corresponds to the block address;
    reading the access information from all the access information holders;
    determining whether the row decoder had been accessed is only the designated block address based on the read access information; and
    determining whether all block addresses are designated, and when all the block addresses are not designated, designating a new block address and repeating the steps from the step of accessing the row decoder.

15. The test method of the semiconductor memory device according to claim 14,
    wherein the step of determining whether the row decoder had been accessed is only the designated block address comprises:
    comparing the access information which is read from the access information holder and expected access information which is a theoretical expected value concerning access information specified based on the designated block address, and outputting a test result signal indicating whether the access information matches with the expected access information.

16. The test method of the semiconductor memory device according to claim 14, further comprising collectively resetting the access information held in the respective access information holders by a reset signal.

17. A test method of a semiconductor memory device which comprises: a memory cell array divided into a plurality of blocks each including a plurality of memory cells; and a plurality of row decoders which correspond to the blocks, each of the row decoders including an access information holder configured to hold access information indicating whether only one access has been made to its corresponding row decoder, the test method comprising:

designating all block addresses in sequence and accessing the row decoders corresponding to all the block addresses in sequence;

reading the access information from all the access information holders; and determining whether only one access has been made to all the row decoders based on the read access information.

18. The test method of the semiconductor memory device according to claim 17, wherein the access information holder holds a first state in which no access has been made, a second state in which only one access has been made, and a third state in which two or more accesses have been made, as the access information.

19. The test method of the semiconductor memory device according to claim 17, wherein the access information holder comprises a latch circuit which shifts to a set state when being accessed once from a reset state, and shifts to a second reset state when being accessed once more from the set state, but does not shift to the set state even if it is accessed once more in the second reset state.

20. A test method of a semiconductor memory device which comprises: a memory cell array divided into a plurality of blocks each of which includes a plurality of memory cells; and a plurality of row decoders which correspond to the blocks, each of the row decoders including an access information holder configured to hold access information indicating whether its corresponding row decoder has been accessed, the test method comprising:

designating a block address and accessing the row decoder which corresponds to the block address;

reading the access information from all the access information holders;

determining whether row decoders corresponding to two or more blocks have been accessed based on the access information; and determining whether all block addresses are designated, and when all the block addresses are not designated, designating a new block address and repeating the steps from the step of accessing the row decoder.

21. The test method of the semiconductor memory device according to claim 20, further comprising:

generating a first current which is proportional to the number of the blocks had been accessed;

generating a second current between a current flowing when one block has been accessed and a current flowing two blocks have been accessed; and comparing the first current and the second current.

22. The test method of the semiconductor memory device according to claim 21, further comprising:

outputting a test result signal indicating a test pass when the first current is smaller than the second current, and outputting a test result signal indicating a test failure when the first current is larger than the second current.

23. The test method of the semiconductor memory device according to claim 22, further comprising:

reading the access information from the access information holders of all the row decoders after all the blocks addresses are accessed, and determining whether any block which has not accessed exists.

* * * * *